(12) United States Patent
Akae et al.

(10) Patent No.: US 8,524,580 B2
(45) Date of Patent: Sep. 3, 2013

(54) MANUFACTURING METHOD OF SEMICONDUCTOR SUBSTRATE AND SUBSTRATE PROCESSING APPARATUS

(75) Inventors: Naonori Akae, Toyama (JP); Yoshiro Hirose, Toyama (JP); Tomohide Kato, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 776 days.

(21) Appl. No.: 12/654,878

(22) Filed: Jan. 7, 2010

(65) Prior Publication Data
US 2010/0190348 A1 Jul. 29, 2010

(30) Foreign Application Priority Data

Jan. 7, 2009 (JP) .................................. 2009-001569
Dec. 25, 2009 (JP) .................................. 2009-295052

(51) Int. Cl.
*H01L 21/20* (2006.01)
*H01L 21/36* (2006.01)
*C23C 16/00* (2006.01)

(52) U.S. Cl.
USPC ......................................... 438/503; 118/724

(58) Field of Classification Search
USPC .......................................... 438/503; 118/724
See application file for complete search history.

(56) References Cited

U.S. PATENT DOCUMENTS 7,468,311 B2 * 12/2008 Dip et al. ...................... 438/478

FOREIGN PATENT DOCUMENTS

JP  A-2005-534181  11/2005
WO WO 2004/009861  1/2004

OTHER PUBLICATIONS

Mar. 26, 2013 Office Action issued in Japanese Patent Application No. 2009-295052 (with translation).

* cited by examiner

*Primary Examiner* — William D Coleman
(74) *Attorney, Agent, or Firm* — Oliff & Berridge, PLC

(57) ABSTRACT

A first processing gas containing a first element and a second processing gas containing a second element are alternately supplied to a surface of a substrate placed in a processing chamber, to thereby form a first thin film, and a second processing gas and a third processing containing the first element and different from the first processing gas are alternately supplied, to thereby form a second thin film on the first thin film, having the same element component as that of the first thin film.

7 Claims, 10 Drawing Sheets

Note: Is this cycle repeated prescribed numbers of times?

(a) In a case of the processing temperature of 300 to 600 °C (b) In a case of the processing temperature of 600 °C or more Note: Is this cycle repeated prescribed numbers of times?

MANUFACTURING METHOD OF SEMICONDUCTOR SUBSTRATE AND SUBSTRATE PROCESSING APPARATUS

BACKGROUND

1. Technical Field

The present invention relates to a manufacturing method of a semiconductor device having the step of forming a thin film on a substrate, and a substrate processing apparatus suitably used in this step.

2. Description of Related Art

With micronization of a flash memory and reduction of an operation power for low power consumption, a tunnel oxide film is likely to be thinner. However, there is a risk of reducing reliability of a device due to insulation breakdown and a stress-induced leak current, while the tunnel oxide film is becoming thinner, and therefore an alternative technique having a floating gate type structure, being a conventional technique, has been requested. Among them, an insulation trap type structure gathers attention, which utilizes charge traps of a nitride layer such as a silicon nitride film (also called a SiN film hereinafter). This is because further micronization is realized by widening electric charge to a trapping medium, in a circumstance that a conventional gate type structure has a high sensitivity to a local defect of the tunnel oxide film and this is a main factor of interrupting further micronization. Further, there is no problem of electrostatic interference in this insulation trap type structure, and this is also a reason for gathering attention.

When a nitride layer formed on the tunnel oxide film is formed by an ALD (Atomic Layer Deposition) method and a CVD (Chemical Vapor Deposition) method, an extremely uniform thin film in terms of its characteristics can be formed. However, a time delay occurs in some cases for starting deposition of the thin film on a substrate surface. Such a time is called an incubation time. A nucleus forming process of performing island-like deposition on the substrate occurs during the incubation time, to thereby form irregularities in this nucleus forming process. Therefore, a film quality is sometimes different from a film formed after the nucleus forming process.

In the insulation trap type structure, when the film quality of a nitride film body, being the thin film formed on the tunnel oxide film, is different from the film quality in an interface between the nitride film and the tunnel oxide film, the electric charge is trapped by not only a nitride layer but also by the interface between the nitride layer and the tunnel oxide film, thus making it impossible to exhibit superiority of the insulation trap type structure. Control of the incubation time is necessary, from a viewpoint of improving the film quality of the interface between the nitride layer and the tunnel oxide film, being a base of film formation, and from the viewpoint of controlling the film quality.

SUMMARY OF THE INVENTION

Accordingly, in order to solve the above-described problem of the conventional technique, an object of the present invention is to provide a manufacturing method of a semiconductor device and a substrate processing apparatus capable of improving the film quality of the interface between the formed thin film and the base, and capable of controlling the film quality.

According to an aspect of the present invention, a manufacturing method of a semiconductor device is provided, including:

forming a first thin film by performing a first film forming step on a surface of a substrate placed in a processing chamber;

forming a second thin film having the same element component as that of the first thin film, on the first thin film by performing a second film forming step;

wherein the first film forming step includes:

a first step of supplying a first processing gas containing a first element into the processing chamber;

a second step of exhausting the first processing gas remained in the processing chamber;

a third step of supplying the second processing gas containing a second element into the processing chamber; and a fourth step of exhausting the second processing gas remained in the processing chamber, wherein the first thin film is formed on the surface of the substrate, with the first to fourth steps set as one cycle, and by performing this cycle prescribed numbers of times, wherein the second film forming step includes:

a fifth step of supplying a third processing gas containing a first element and having an element component different from that of the first processing gas;

a sixth step of exhausting the third processing gas remained in the processing chamber;

a seventh step of supplying the second processing gas containing the second element into the processing chamber; and an eighth step of exhausting the second processing gas remained in the processing chamber, wherein the second thin film is formed on the surface of the first thin film, with the fifth to eighth steps set as one cycle, and by performing this cycle prescribed numbers of times.

According to other aspect of the present invention, a manufacturing method of a semiconductor device is provided, including the steps of:

forming a thin film on a surface of a substrate placed in a processing chamber by performing a film forming step; and thereafter modifying the thin film by performing a modifying process, wherein the film forming step includes:

a first step of supplying a first processing gas containing a first element into the processing chamber;

a second step of exhausting the first processing gas remained in the processing chamber;

a third step of supplying a second processing gas containing a second element into the processing chamber; and a fourth step of exhausting the second processing gas remained in the processing chamber, wherein the thin film is formed, with the first to fourth steps set as one cycle and by repeating this cycle prescribed numbers of times, and in a modifying step, the thin film is modified by supplying the second processing gas activated by plasma-excitation into the processing chamber, and the thin film of a prescribed film thickness is formed by repeating the film forming step and the modifying step prescribed numbers of times while a temperature of the substrate is maintained to be a constant temperature.

According to other aspect of the present invention, a substrate processing apparatus is provided, including:

a processing chamber that accommodates a substrate;

a heating mechanism that heats at least the substrate;

a first processing gas supply system for supplying a first processing gas containing a first element and a second processing gas containing the first element and different from the first processing gas;

a second processing gas supply system for supplying a third processing gas containing a second element into the processing chamber;

an exhaust system that exhausts an atmosphere in the processing chamber; and a control part for controlling the first processing gas supply system, the second processing gas supply system, and the exhaust system, wherein the control part controls the heating mechanism, the first processing gas supply system, the second processing gas supply system, and the exhaust system, so that the first processing gas and the third processing gas are alternately supplied into the processing chamber to thereby form the first film, while heating at least the substrate to a prescribed temperature, and thereafter the second processing gas and the third processing gas are alternately supplied into the processing chamber to thereby form a second film, with the first film and the second film having the same element components.

According to other aspect of the present invention, a substrate processing apparatus is provided, including:

a processing chamber that accommodates a substrate;

a heating mechanism that heats at least the substrate;

a first processing gas supply system that supplies a first processing gas;

a second processing gas supply system that supplies a second processing gas into the processing chamber;

an exhaust system that exhausts an atmosphere in the processing chamber; and a control part for controlling the first processing gas supply system, the second processing gas supply system, and the exhaust system, wherein the control part controls the heating mechanism, the first processing gas supply system, the second processing gas supply system, and the exhaust system, so that the first processing gas and the second processing gas are alternately supplied into the processing chamber to thereby form a film, and thereafter the film formed by supplying the second processing gas into the processing chamber is modified, wherein a film forming process and a film modifying process are performed at the same temperature, and the film forming process and the film modifying process are repeated until a prescribed film thickness is obtained.

According to the present invention, the film quality on an interface between the formed thin film and the base can be improved, and the film quality of the formed thin film can be controlled.

DESCRIPTION OF PREFERRED EMBODIMENT OF THE INVENTION

First Embodiment

A manufacturing method of a semiconductor device and a substrate processing apparatus according to an embodiment of the present invention will be described hereinafter, based on the drawings. Here, a first embodiment for performing a film forming step of forming a SiN thin film will be described.

In the first embodiment, as an example, the substrate processing apparatus is constituted as a semiconductor manufacturing device for executing a film forming step, being a substrate processing step in a manufacturing method of a semiconductor device (such as IC). Note that in a description hereinafter, a case of using a batch-type vertical apparatus (simply called a processing apparatus in some cases hereinafter) will be described, which is an apparatus as the substrate processing apparatus for applying an oxidation, dispersion process and a CVD process to a substrate.

Figure 1:
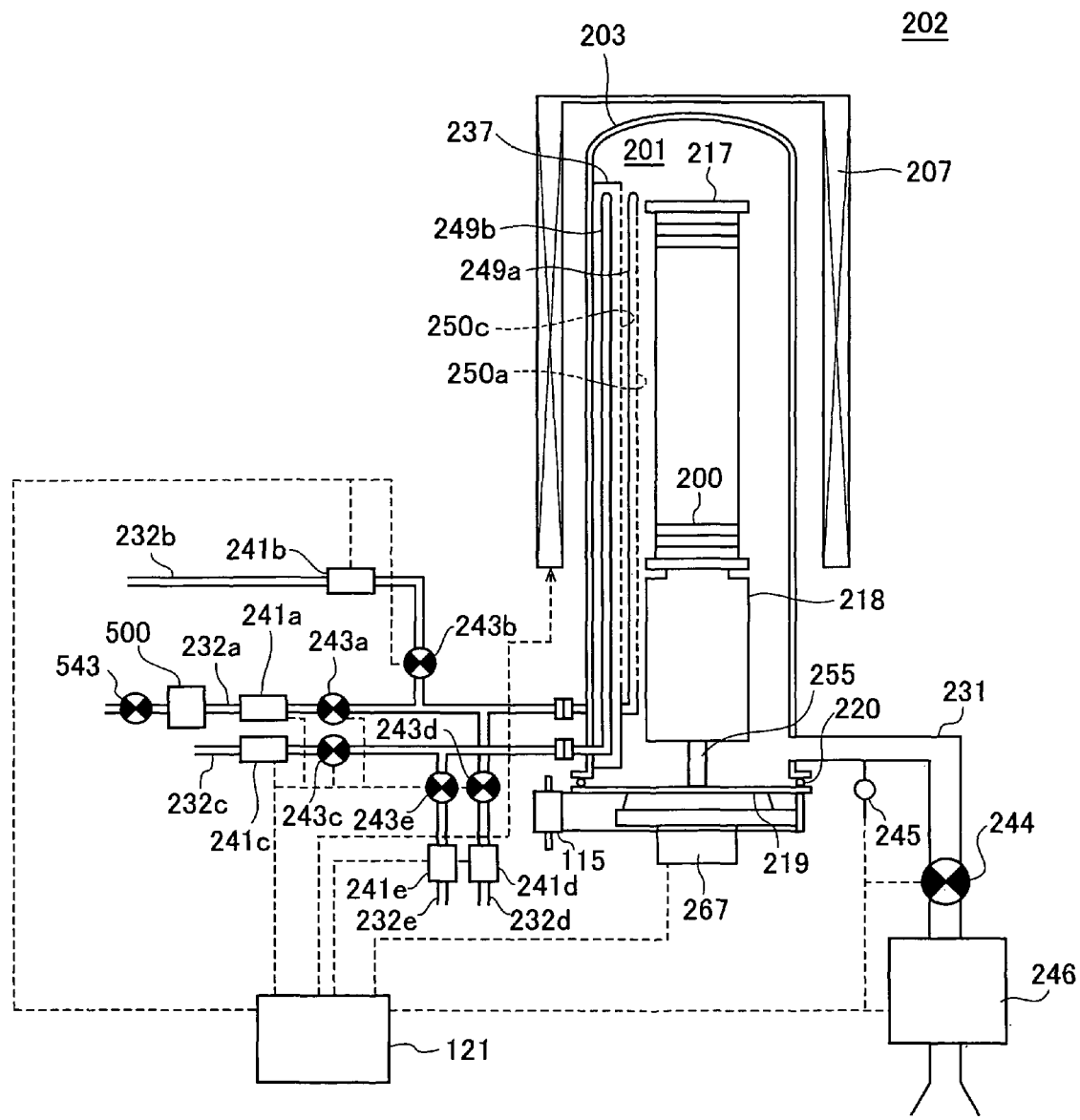
FIG. 1 is a schematic block diagram of a vertical processing furnace of a substrate processing apparatus according to a first embodiment of the present invention, and is a view showing a vertical sectional face of a processing furnace portion.
Figure 2:
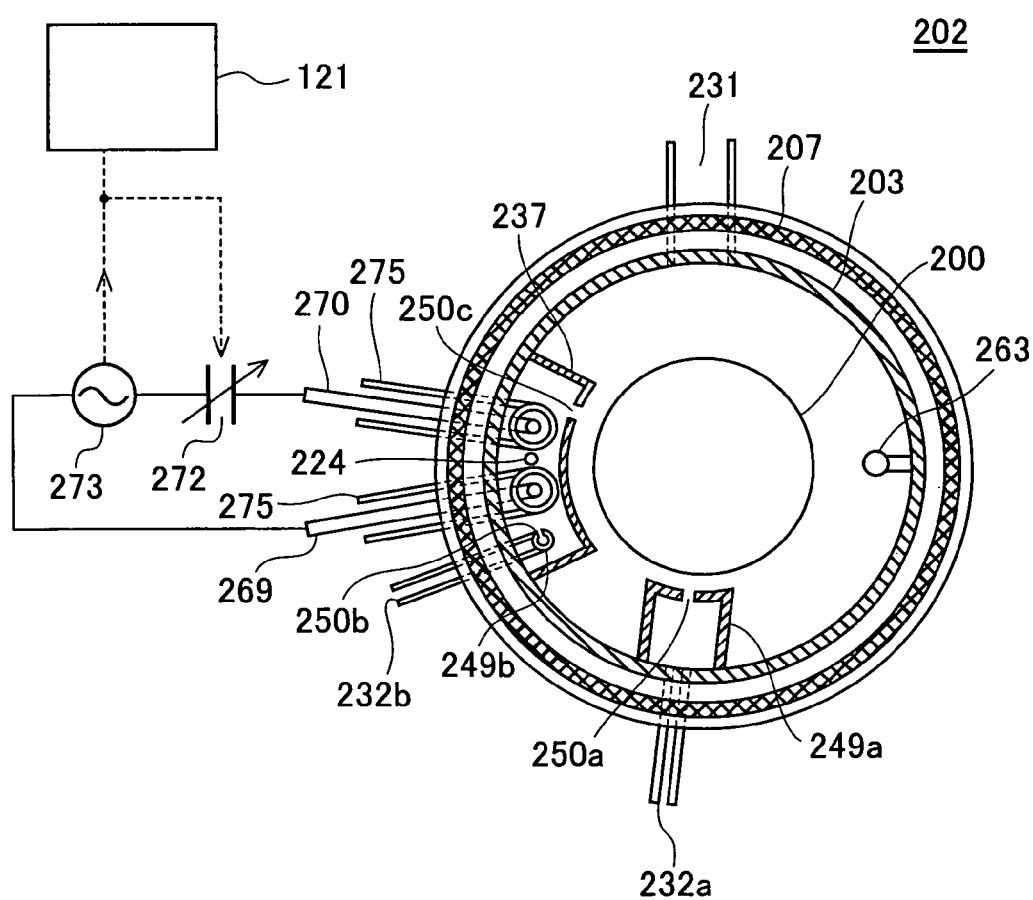
FIG. 2 is a view is a schematic block diagram of the vertical processing furnace of the substrate processing apparatus according to the first embodiment of the present invention, and is a view showing a cross-sectional face of the processing furnace portion.

FIG. 1 is a schematic block diagram of a vertical processing furnace of the substrate processing apparatus according to this embodiment, wherein a processing furnace portion 202 is shown by a vertical sectional face, and FIG. 2 is a schematic block diagram of the vertical processing furnace of the substrate processing apparatus according to this embodiment, and shows a cross-sectional face of the processing furnace portion 202.

As shown in FIG. 1, the processing furnace 202 has a heater 207, being a heating means (heating mechanism). The heater 207 has a cylindrical shape, and is vertically installed in such a manner as being supported by a heater base (not shown), being a holding plate. A reaction tube 203 is provided inside of the heater 207, thereby constituting a reaction vessel (processing vessel) concentrically with the heater 207.

A seal cap 219, being a furnace port lid member capable of air-tightly closing a lower end opening of the reaction tube 203, is provided in a lower part of the reaction tube 203. The seal cap 219 is abutted on the lower end of the reaction tube 203 from a lower side in a vertical direction. The seal cap is made of, for example, metal such as stainless, and is formed into a disc shape. An O-ring 220, being a seal member abutted on the lower end of the reaction tube 203, is provided on an upper face of the seal cap 219. A rotation mechanism 267 for rotating a boat is provided on an opposite side to the processing chamber 201 across the seal cap 219. A rotary shaft 255 of the rotation mechanism 267 is passed through the seal cap, and is connected to a boat 217 as will be described later, so that a wafer 200 is rotated by rotating the boat 217. The seal cap 219 is elevated/descended vertically by a boat elevator 115, being an elevation mechanism provided outside of the reaction tube 203, thereby making it possible to load/unload the boat 217 into/from the processing chamber 201.

The boat 217, being a substrate holding means (supporting tool) is erected on the seal cap 219, via a quartz cap 218, being a heat insulating member. The quartz cap 218 is made of a heat-resistant material such as quartz and silicon carbide, and functions as a heat insulating part, and also serves as a holding member for holding the boat. The boat 217 is made of a heat-resistant material such as quartz and silicon carbide, and is constituted so that a plurality of wafers 200 are supported in multiple stages in a tube axial direction, in such a manner as being arranged with centers thereof aligned with each other in horizontal postures.

A first nozzle 249a and a second nozzle 249b are provided in a lower part of the reaction tube 203 in the processing chamber 201, so as to pass through the reaction tube 203. A first gas supply tube 232a is connected to the first nozzle 249a, and further a second gas supply tube 232b is connected to the first gas supply tube 232a, on the up-stream side of a connection part (joint part) between the first nozzle 249a and the first gas supply tube 232a. Further, a third gas supply tube 232c is connected to the second nozzle 249b. Thus, two nozzles 249a and 249b and three gas supply tubes 232a, 232b, and 232c are provided to the reaction tube 203, so that a plurality of kinds of gases, at least three kinds of gases here, can be supplied into the processing chamber 201.

A valve 543, being an open/close valve, a vaporizer (vaporizing apparatus) 500, a mass flow controller (MFC) 241a, being a flow rate control unit (flow rate control part), and a valve 243a, being an open/close valve, are provided on the first gas supply tube 232a sequentially from an upstream direction. Moreover, the second gas supply tube 232b is connected to a downstream side of the valve 243a of the first gas supply tube 232a. A mass flow controller (MFC) 241b, being a flow rate control unit (flow rate control part), and a valve 243b, being an open/close valve, are provided to the second gas supply tube 232b sequentially from an upstream direction. Further, an inactive gas supply tube 232d is connected to the downstream side of the connection part between the first gas supply tube 232a and the second gas supply tube 232b. A mass flow controller 241d, being a flow rate control unit (flow rate control part), and a valve 243d, being an open/close valve, are provided to the inactive gas supply tube 232d sequentially from the upstream direction. In addition, the aforementioned first nozzle 249a is connected to a tip part of the first gas supply tube 232a. The first nozzle 249a is provided in an arc-shaped space between an inner wall of the reaction tube 203 and the wafer 200, along a lower part to an upper part of the inner wall of the reaction tube 203, in such a manner as rising upward in a stacking direction of the wafer 200. The first nozzle 249a is constituted as an L-shaped long nozzle. A gas supply hole 250a for supplying gas is provided on a side face of the first nozzle 249a. The gas supply hole 250a is opened so as to face the center of the reaction tube 203. A plurality of gas supply holes 250a are provided so as to be extended from the lower part to the upper part of the reaction tube 203, each of them having the same opening area and further provided at the same opening pitch. A first gas supply system is constituted mainly by the first gas supply tube 232a, the second gas supply tube 232b, valves 543, 243a, 243b, the vaporizer 500, mass flow controllers 241a, 241b, and the first nozzle 249a. Further, a first inactive gas supply system is constituted mainly by the inactive gas supply tube 232d, the mass flow controller 241d, and the valve 243d.

A mass flow controller (MFC) 241c, being a flow rate control unit (flow rate control part), and a valve 243c, being an open/close valve, are provided to the third gas supply tube 232c sequentially from the upstream direction. Further, an inactive gas supply tube 232e is connected to a downstream side of the valve 243c of the third gas supply tube 232c. A mass flow controller 241e, being a flow rate control unit (flow rate control part), and a valve 243e, being an open/close valve, are provided to the inactive gas supply tube 232e sequentially from the upstream direction. Further, the aforementioned second nozzle 249a is connected to the tip part of the third gas supply tube 232c. The second nozzle 249a is provided inside of a buffer chamber 237, being a gas dispersion space.

The buffer chamber is provided in the arc-shaped space between the inner wall of the reaction tube 203 and the wafer 200, at a part extending from the lower part to the upper part of the inner wall of the reaction tube 203, along the stacking direction of the wafer 200. A gas supply hole 250c for supplying gas is provided on an end portion of a wall adjacent to the wafer 200 in the buffer chamber 237. The gas supply hole 250c is opened in such a manner as facing the center of the reaction tube 203. A plurality of gas supply holes 250c are provided so as to be extended from the lower part to the upper part of the reaction tube 203, each of them having the same opening area and further provided at the same opening pitch.

The second nozzle 249b is provided on the end portion of the opposite side to the end portion where the gas supply hole 250c of the buffer chamber 237 is provided, along the lower part to the upper part of the inner wall of the reaction tube 203, in such a manner as rising upward in the stacking direction of the wafer 200. The second nozzle 249b is constituted as an L-shaped long nozzle. A gas supply hole 250b for supplying gas is provided on the side face of the second nozzle 249b. The gas supply hole 250b is opened so as to face the center of the buffer chamber 237. In the same way as the gas supply hole 250c, a plurality of gas supply holes 250b are provided so as to be extended from the lower part to the upper part of the reaction tube 203. An opening area of each of the plurality of gas supply holes 250b is preferably set to be the same opening area at the same opening pitch from the upstream side (lower part) to the downstream side (upper part) when a differential pressure between inside of the buffer chamber 237 and inside of the processing chamber 201 is small. However, each opening area is preferably set to be greater or the opening pitch is set to be small toward the upstream side to the downstream side when the differential pressure is large.

In this embodiment, by adjusting the opening area and the opening pitch of each gas supply hole 250b as described above from the upstream side to the downstream side, gas of approximately the same flow rate is injected from each of the gas supply holes 250b irrespective of the flow velocity. Then, the gas injected from each of the gas supply holes 250b is introduced into the buffer chamber 237 once, and a difference in the flow velocity of the gas is made uniform in the buffer chamber 237.

Namely, the gas injected into the buffer chamber 237 from each gas supply hole 250b of the second nozzle 249b is injected into the processing chamber 201 from the gas supply hole 250c of the buffer chamber 237, after a particle velocity of each gas is decreased in the buffer chamber 237. Thus, the gas injected into the buffer chamber 237 from each gas supply hole 250b becomes the gas having uniform flow rate and flow velocity, when it is injected into the processing chamber 201 from each gas supply hole 250c.

The second gas supply system is constituted mainly by the second gas supply tube 232b, the mass flow controller 241b, the valve 243b, the second nozzle 249b, and the buffer chamber 237. Also, the second inactive gas supply system is constituted mainly by the inactive gas supply tube 232e, the mass flow controller 241e, and the valve 243e.

From the first gas supply tube 232a, for example, silicon source gas, namely gas (silicon-containing gas) containing silicon (Si) as a first element is supplied into the processing chamber 201 as a first processing gas, via the valve 543, the vaporizer 500, the mass flow controller 241a, the valve 243a, and the first nozzle 249a. As the silicon-containing gas, for example, hexachlorodisilane ($Si_2Cl_6$: HCD) gas can be used.

Note that the first processing gas may be any one of solid, liquid, and vapor at a normal temperature and under a normal pressure. However, the first processing gas as liquid will be described here. When the first processing gas is set in a vapor state at a normal temperature and under a normal pressure, there is no necessity for providing the vaporizer 500. Further, although the first processing gas is the processing gas of different kind from the third processing gas as will be described later, the first processing gas is sometimes the processing gas with higher reactivity than the third processing gas. Here, the high reactivity means a high thermal decomposition property. Namely, HCD is decomposed from 350° C., like $2Si_2Cl_6 \rightarrow Si+3SiCl_4$.

From the second gas supply tube 232b, silicon-containing gas containing silicon (Si) as at least the first element, which is the gas of a different kind from the first processing gas, is supplied into the processing chamber 201 as the third processing gas, via the mass flow controller 241b, the valve 243b, and the first nozzle 249a. As the silicon-containing gas, for example, dichlorosilane ($SiH_2Cl_2$, DCS) gas can be used.

From the third gas supply tube 232c, for example, gas containing nitrogen (N) as a second element is supplied into the processing chamber 201 as a second processing gas for modifying a source gas, via the mass flow controller 241c, the valve 243c, the second nozzle 249b, and the buffer chamber 237. As the nitrogen-containing gas, for example, ammonia ($NH_3$) gas can be used.

From inactive gas supply tubes 232d and 232e, for example nitrogen ($N_2$) gas, being the inactive gas, is supplied into the processing chamber 201, via mass flow controllers 241d and 241e, valves 243d and 243e, gas supply tubes 232a and 232c, nozzles 249a, 249b, and the buffer chamber 237.

Note that for example when the aforementioned gases are respectively flown from each gas supply tube, a source gas supply system, namely a silicon-containing gas supply system (silane-based gas supply system) is constituted by the first gas supply system. Further, a modifying gas supply system, namely a nitrogen-containing gas supply system is constituted by the second gas supply system.

As shown in FIG. 1 and FIG. 2, in the buffer chamber 237, a first rod electrode 269, being a first electrode, and a second rod electrode 270, being a second electrode having narrow and long structures are arranged along the stacking direction of the wafer 200, extending from the lower part to the upper part of the reaction tube 203. The first rod electrode 269 and the second rod electrode 270 are provided in parallel to the second nozzle 249b, and are protected by being covered by an electrode protective tube 275, being a protective tube for protecting each electrode extending from the upper part to the lower part. Either one of the first rod electrode 269 and the second rod electrode 270 is connected to a high frequency power source 273 via a matching device 272, and the other one is connected to earth, being a reference electric potential. As a result, plasma is generated in a plasma generation area 224 between the first rod electrode 269 and the second rod electrode 270. A plasma source is constituted mainly by the first rod electrode 269, the second rod electrode 270, the electrode protective tube 275, the matching device 272, and the high frequency power source 273. Note that the plasma source functions as an activation mechanism for activating the gas by plasma as will be described later.

The electrode protective tube 275 can be inserted into the buffer chamber 237, with each of the first rod electrode 269 and the second rod electrode 270 separated from the atmosphere of the buffer 237. Here, when the inside of the electrode protective tube 275 is set in the same atmosphere as outer air (atmosphere), the first rod electrode 269 and the second rod electrode 270 respectively inserted into the electrode protective tube 275 are oxidized by heat by the heater 207. Therefore, an inactive gas purge mechanism (not shown) is provided, so that the inside of the electrode protective tube 275 is filled or purged with the inactive gas such as nitrogen, to thereby sufficiently suppress oxygen concentration to be low, and prevent oxidation of the first rod electrode 269 or the second rod electrode 270.

An exhaust tube 231 for exhausting the atmosphere in the processing chamber 201 is provided in the reaction tube 203. A vacuum pump, being a vacuum exhaust apparatus, is connected to the exhaust tube 231, via a pressure sensor 245, being a pressure detection unit (pressure detector) for detecting a pressure in the processing chamber 201, and an APC (Auto Pressure Control part) valve 244, being a pressure adjustment unit (pressure adjuster), so that vacuum exhaust can be carried out to set the pressure in the processing chamber 201 to be a prescribed pressure (degree of vacuum). Note that the APC valve 244 is an open/close valve capable of opening/closing a valve to start/stop the vacuum exhaust in the processing chamber 201, and further capable of adjusting the pressure in the processing chamber 201 by adjusting a valve opening degree. An exhaust system is constituted mainly by the exhaust tube 231, the APC valve 244, the vacuum pump 246, and the pressure sensor 245.

A temperature sensor 263, being a temperature detection unit, is installed in the reaction tube 203, so that by adjusting a power supply condition to the heater 207 based on temperature information detected by the temperature sensor 263, the temperature in the processing chamber 201 is set to have a desired temperature distribution. The temperature sensor 263 is formed into the L-shape in the same way as the nozzles 249a and 249b, and is provided along the inner wall of the reaction tube 203.

A controller 121, being a control part (control means) is connected to the mass flow controllers 241a, 241g, 241c, 241d, and 241e, valves 543, 243a, 243b, 243c, 243d, and 243e, vaporizer 500, pressure sensor 245, APC valve 244, vacuum pump 246, heater 207, temperature sensor 263, boat rotation mechanism 267, boat elevator 115, high frequency power source 273, and matching device 272, etc. The controller 121 performs flow rate adjustment operation of each kind of gas by the mass flow controllers 241a, 241b, 241c, 241d, and 241e, open/close operation of the valves 543, 243a, 243b, 243c, 243d, and 243e, pressure adjustment operation based on opening/closing of the APC valve 244 and the pressure sensor 245, temperature adjustment operation of the heater 207 based on the temperature sensor 263, control of the vaporizer 500, start/stop of the vacuum pump 246, rotation speed adjustment operation of the boat rotation mechanism 267, control of elevating operation, etc, of the boat elevator 115, control of the power supply from the high frequency power source 273, and impedance control by the matching device 272.

Next, explanation will be given for a sequence example for forming an insulation film on the substrate, as one step of the manufacturing steps of the semiconductor device by using a processing furnace of the substrate processing apparatus. Note that in the explanation given hereinafter, the operation of each part constituting the substrate processing apparatus is controlled by the controller 121.

In a conventional CVD (Chemical Vapor Deposition) method and ALD (Atomic Layer Deposition) method, for example, in a case of the CVD method, a plurality of kinds of gases including a plurality of elements constituting the formed film are simultaneously supplied, and meanwhile, in a case of the ALD method, a plurality of kinds of gases including a plurality of elements constituting the formed film are alternately supplied. Then, a silicon nitride film (SiN film) and a silicon oxide film (SiO film) are formed by controlling supply conditions such as gas supply flow rate and gas supply time during supplying gas, and plasma power. In such a technique, for example, in a case of forming the SiN film, the supply conditions are controlled, for the purpose of setting a composition ratio of the film to be a stoichiometric composition satisfying N/Si≈1.33, and also for example in a case of forming the SiO film, the supply conditions are controlled for the purpose of setting the composition ratio of the film to be a stoichiometric composition satisfying O/Si≈2.

Meanwhile, it is also possible to control the supply conditions for the purpose of setting the composition ratio of the formed film to be a prescribed composition ratio different from the stoichiometric composition. Namely, the supply conditions are controlled for the purpose of setting the composition ratio of the film so that at least one element of a plurality of elements constituting the formed film becomes more excessive than other element, with respect to the stoichiometric composition. The film formation is also possible, while controlling the ratio of the plurality of elements constituting the formed film, namely controlling the composition ratio of the film. Explanation will be given first hereinafter for a sequence example of forming a film having the stoichiometric composition by alternately supplying a plurality of kinds of gases containing different kinds of elements.

Figure 3:
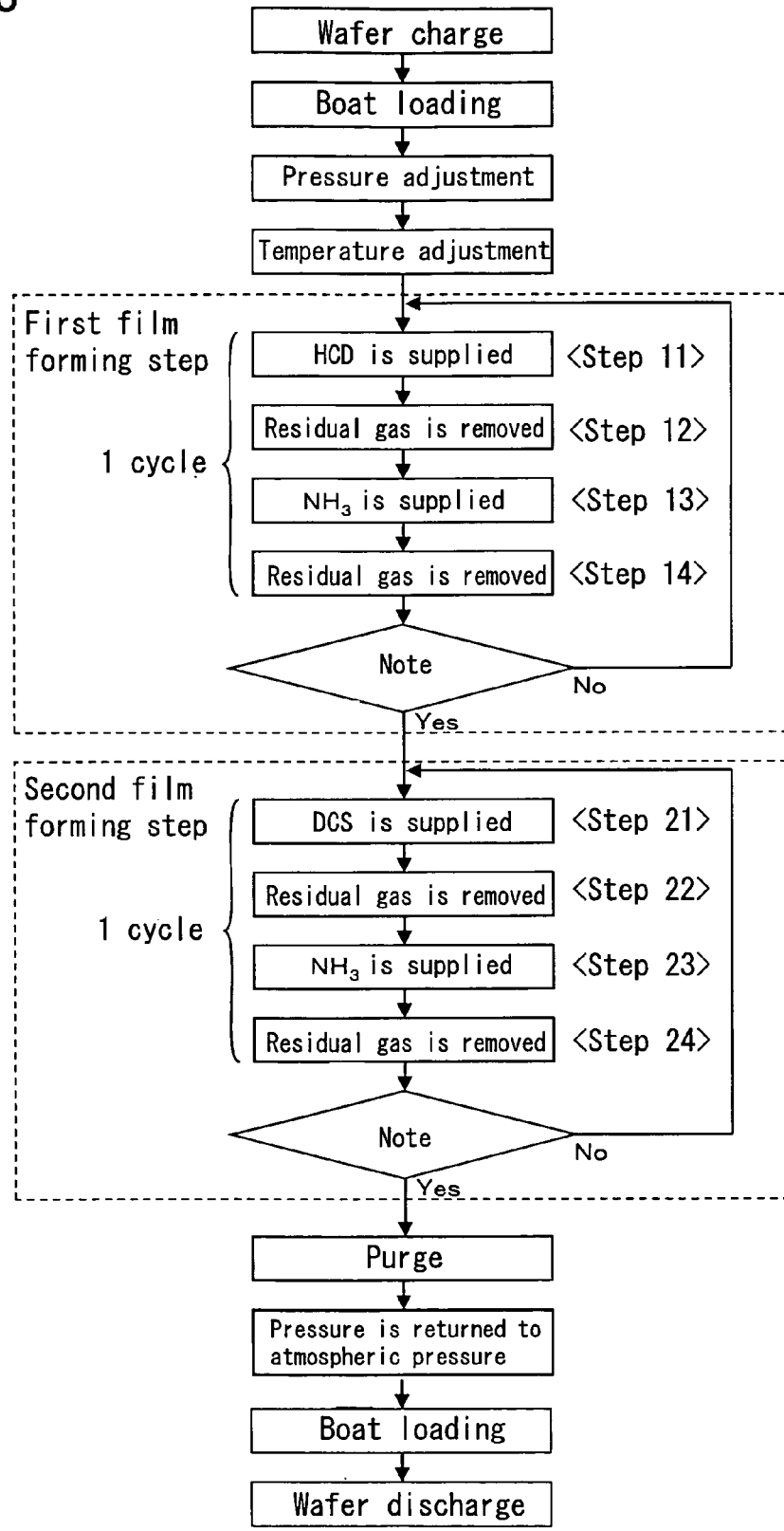
FIG. 3 is a flowchart explaining a process, according to the first embodiment of the present invention.
Figure 4:
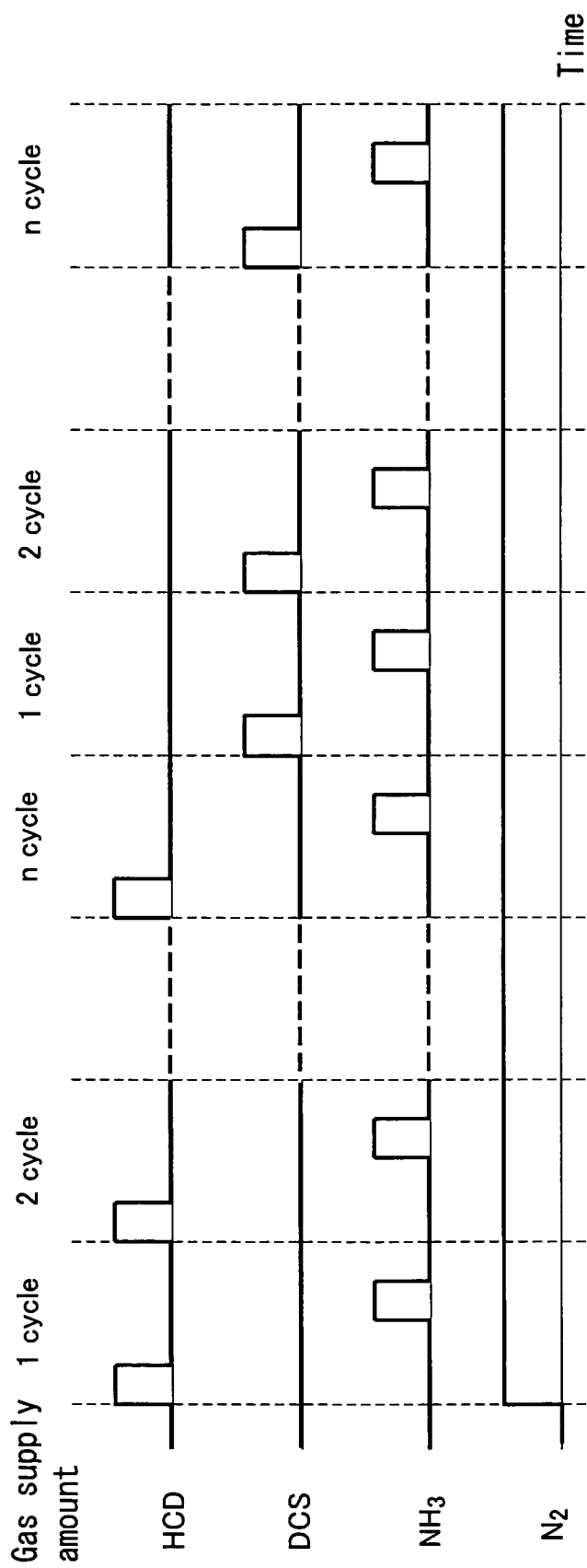
FIG. 4 is a view showing a process sequence, according to the first embodiment of the present invention.

Here, with the first element defined as silicon (Si), and the second element defined as nitrogen (N), an example of forming the SiN film on the substrate as the insulation film will be described, with reference to FIG. 3 and FIG. 4, using HCD gas, being the silicon-containing gas as the first processing gas containing the first element, DCS gas containing the first element, being the silicon-containing gas as a different kind of the third processing gas from the first processing gas, and NH$_3$ gas, being the nitrogen-containing gas as the second processing gas containing the second element. FIG. 3 is a flowchart explaining a process in this embodiment, and FIG. 4 is a view showing a process sequence in this embodiment. Note that in this example, the silicon-containing gas supply system (first element-containing gas supply system) is constituted by the first gas supply system, and a nitrogen-containing gas supply system (second element-containing gas supply system) is constituted by the second gas supply system.

In this embodiment, the film forming step of forming the SiN film is executed by two stages. Namely; the film forming step includes the steps of forming a first SiN film (first thin film, initial SiN film) (first thin film forming step), and thereafter forming a second thin film having the same element component as that of the first thin film (second thin film forming step). First, the first SiN film is formed by supplying the HCD gas and the NH$_3$ gas into the processing chamber 202, and thereafter the second SiN film is formed by supplying the DCS gas and the NH$_3$ gas. Each thin film formed by two stages has the same element component. Note that the HCD gas, being the first processing gas, has a higher reactivity, namely higher thermal decomposition property than those of the DCS gas, being the third processing gas.

First, when a plurality of wafers 200 are charged into the boat 217 (wafer charge), as shown in FIG. 1, the boat 217 supporting the plurality of wafers 200 is lifted by the boat elevator 115, and is loaded into the processing chamber 201 (boat loading). In this state, the seal cap 219 is set in a state of sealing the lower end of the reaction tube 203 via the O-ring 220.

The inside of the processing chamber 201 is vacuum-exhausted by the vacuum pump 246 so as to be set in a desired pressure (degree of vacuum). At this time, the pressure in the processing chamber 201 is measured by the pressure sensor 245, and based on the measured pressure, the APC valve 244 is feedback-controlled (pressure adjustment). Further, the inside of the processing chamber 201 is heated by the heater 207 so as to be set to a desired temperature. At this time, the power supply condition to the heater 207 is feedback-controlled based on the temperature information detected by the temperature sensor 263, so that the inside of the processing chamber 201 has a desired temperature distribution (temperature adjustment). Subsequently, the wafer 200 is rotated by rotating the boat 217 by the rotation mechanism 267. Next, the first film forming step of forming the first SiN film is performed by supplying the HCD gas and the NH$_3$ gas into the processing chamber 202. In the first film forming step, the following four steps are sequentially executed.

(First Film Forming Step)
<Step 11>

In step 11, first, the HCD gas is flown (first step). Valves 543 and 243a of the first gas supply tube 232a are opened, to thereby flow the HCD gas into the first gas supply tube 232a via the vaporizer 500. The flow rate of the HCD gas flown into the first gas supply tube 232a is adjusted by the mass flow controller 241a. The HCD gas, with its flow rate adjusted, is exhausted from the gas exhaust tube 231, while being supplied into the processing chamber 201 from the gas supply hole 250a of the first nozzle 249a. At this time, the valve 243d is simultaneously opened, to flow the inactive gas into the inactive gas supply tube 232d. As the inactive gas, group 18 element gas such as He gas, Ne gas, and Ar gas is suitable. However, N$_2$ gas may also be used, because the temperature of the heater 207, namely the temperature of the wafer 200 is set to be low. The N$_2$ gas, with its flow rate adjusted, is exhausted from the gas exhaust tube 231, while being supplied into the processing chamber 201 together with the HCD gas.

At this time, the pressure in the processing chamber 201 is set to be a pressure within a range of, for example, 10 to 1000 Pa, by suitably adjusting the APC valve 244. The supply flow rate of the HCD gas controlled by the mass flow controller 241b, is set to be a flow rate, for example, within 100 to 5000 sccm. The time required for exposing the HCD gas to the wafer 200, namely a gas supply time (irradiation time) is set to be, for example, within 2 to 120 seconds. At this time, the temperature of the heater 207 is set, so that the temperature of the wafer 200 is set to be, for example, within 300 to 600° C.

By supply of the HCD gas, a first layer containing silicon as the first element, is formed on a base film on the surface of the wafer 200. Namely, a silicon layer (Si layer), being the silicon-containing layer of less than 1 atomic layer to several atomic layers is formed on the wafer 200 (on the base film). The silicon-containing layer may be a chemical adsorption layer (surface adsorption layer) of HCD. Note that silicon is an element which becomes solid by itself. Here, the silicon layer includes a continuous layer constituted of silicon and also a discontinuous layer thereof, and a thin film formed by overlapping of these layers. Note that the continuous layer constituted of silicon is also called the thin film in some cases. Further, the chemical adsorption layer of HCD includes a continuous chemical adsorption layer of HCD molecules and also a discontinuous chemical adsorption layer thereof. In addition, when the thickness of the silicon-containing layer formed on the wafer 200 exceeds several atomic layers, an action of nitrogen in the step 13 as will be described later does not reach an entire body of the silicon-containing layer. Further, a minimum value of the silicon-containing layer that can be formed on the wafer 200 is less than 1 atomic layer. Therefore, the thickness of the silicon-containing layer is preferably set to be in a range from less than 1 atomic layer to the several atomic layers. Note that the layer to be formed can be adjusted by adjusting the conditions of the temperature of the wafer 200 and the pressure in the processing chamber 201, so that the silicon layer is formed by deposition of silicon on the wafer 200 under the condition that the HCD gas is self-decomposed, and the chemical adsorption layer of HCD is formed by chemical adsorption of HCD on the wafer 200 under the condition that the HCD gas is not self-decomposed. Note that a film forming rate can be set to be high in a case of forming the silicon layer on the wafer 200, compared with a case of forming the chemical adsorption layer of HCD on the wafer 200. Further, a finer layer can be formed in a case of forming the silicon layer on the wafer 200, compared with a case of forming the chemical adsorption layer of HCD on the wafer 200.

<Step 12>

In step 12 (second step), after the silicon-containing layer is formed, the valve 243a is closed, to thereby stop the supply of the HCD gas. At this time, the inside of the processing chamber 201 is vacuum-exhausted by the vacuum pump 246, with the APC valve 244 of the gas exhaust tube 231 opened, and unreacted HCD gas or the HCD gas after contributing to forming the silicon-containing layer remained in the processing chamber 201 is removed from the processing chamber 201. Note that the supply of the $N_2$ gas into the processing chamber 201 is maintained, with the valve 243d at this time opened. Thus, it is possible to increase an effect of removing from the processing chamber 201, the unreacted HCD gas or the HCD gas after contributing to forming the silicon-containing layer remained in the processing chamber 201. As the inactive gas, rare gases such as Ar gas, He gas, Ne gas, and Xe gas can be used, other than $N_2$ gas.

<Step 13>

In step 13, after the residual gas in the processing chamber 201 is removed, the valve 243c of the third gas supply tube 232c is opened, to thereby flow the $NH_3$ gas into the third gas supply tube 232c (third step). The flow rate of the $NH_3$ gas flown through the third gas supply tube 232c is adjusted by the mass flow controller 241c. The $NH_3$ gas whose flow rate is adjusted is supplied into the buffer chamber 237 from the gas supply hole 250b of the second nozzle 249b. At this time, high frequency power is applied between the first rod electrode 269 and the second rod electrode 270 from the high frequency power source 273 via the matching device 272, to thereby make the $NH_3$ gas supplied into the buffer chamber 237 subjected to plasma-excitation, and the $NH_3$ gas thus subjected to plasma-excitation is exhausted from the gas exhaust tube 231 while being supplied into the processing chamber 201 from the gas supply hole 250c as active species. At this time, simultaneously the valve 243e is opened, and the $N_2$ gas is flown through the inactive gas supply tube 232e. The $N_2$ gas is exhausted from the gas exhaust tube 231 while being supplied into the processing chamber 201 together with the $NH_3$ gas.

When the $NH_3$ gas is plasma-excited and is flown as the active species, the pressure in the processing chamber 201 is set to be the pressure, for example, within a range of 10 to 100 Pa by appropriately adjusting the APC valve 244. The supply flow rate of the $NH_3$ gas controlled by the mass flow controller 241c is set to be the flow rate, for example, within a range of 1000 to 10000 sccm. The time for exposing the wafer 200 to the active species obtained by plasma-exciting the $NH_3$ gas, namely a gas supply time (irradiation time) is set to be the time, for example, within a range of 2 to 120 seconds. In the same way as step 11, the temperature of the heater 207 at this time is set, so that the temperature of the wafer 200 falls within a range of 300 to 600° C. Note that the high frequency power applied between the first rod electrode 269 and the second rod electrode 270 from the high frequency power source 273 is set to be the power, for example, within a range of 50 to 1000 W. The $NH_3$ gas has a high reaction temperature, and is hardly reacted at the aforementioned wafer temperature and under the aforementioned pressure in the processing chamber. Therefore, the $NH_3$ gas is plasma-excited and is then flown as the active species, and therefore the temperature of the wafer 200 may be remained to be in a low temperature range as described above. Note that it is also possible to thermally activate the $NH_3$ gas with non-plasma, without plasma-excitation when the $NH_3$ gas is supplied, by setting the temperature of the wafer 200 to be, for example 600° C. or more by appropriately adjusting the temperature of the heater 207, and by setting the pressure in the processing chamber 201 to be, for example within a range of 50 to 3000 Pa by appropriately adjusting the APC valve 244. Note that when the $NH_3$ gas is thermally activated and supplied, a soft reaction can be generated.

At this time, the gas flown through the processing chamber 201 is the active species obtained by plasma-exciting the $NH_3$ gas, or the $NH_3$ gas thermally activated by increasing the pressure in the processing chamber 201, and the DCS gas is not flown through the processing chamber 201. Accordingly, in step 11, the $NH_3$ gas does not cause the vapor phase reaction, and the $NH_3$ gas turned to the active species, or the activated $NH_3$ gas, reacts with a part of the silicon-containing layer, being the first layer, formed on the wafer 200. Thus, the silicon-containing layer is nitrided, and is modified to a second layer containing silicon (first element) and nitrogen (second element), namely, modified to a silicon-nitride layer (SiN layer).

<Step 14>

In step 14 (fourth step), the supply of the $NH_3$ gas is stopped by closing the valve 243c of the third gas supply tube 232c. At this time, the inside of the processing chamber 201 is vacuum-exhausted by the vacuum pump 246, with the APC valve 244 of the gas exhaust tube 231 opened, and the unreacted $NH_3$ gas or the $NH_3$ gas after contributing to nitriding remained in the processing chamber 201 is removed from the processing chamber 201. Note that at this time, the supply of the $N_2$ gas into the processing chamber 201 is maintained, with the valve 243e opened. Thus, it is possible to increase an effect of removing the unreacted $NH_3$ gas or the $NH_3$ gas after contributing to nitriding remained in the processing chamber 201 from the processing chamber 201.

As the nitrogen-containing gas, it is possible to use the gas obtained by exciting the $N_2$ gas, $NF_3$ gas, and $N_3H_8$ gas by plasma and heat, other than the gas obtained by exciting the $NH_3$ gas by plasma and heat, or it is also possible to use the gas obtained by diluting the aforementioned gases with rare gases such as Ar gas, He gas, Ne gas, and Xe gas.

With the aforementioned steps 11 to 14 set as one cycle, and by repeating this cycle at least once or more, the first thin film containing silicon (first element) and nitrogen (second element) of a prescribed film thickness, namely, the first SiN film can be formed on the wafer 200. Note that the aforementioned cycle is preferably repeated multiple numbers of times.

(Second Film Forming Step)

Next, the second film forming step is performed, for forming the second SiN film by supplying the DCS gas and the NH$_3$ gas into the processing chamber 202. In the second film forming step, the following four steps are sequentially executed.

<Step 21>

In step 21, first, the DCS gas is flown (fifth step). The second valve 243b of the second gas supply tube 232b is opened, to flow the DCS gas into the second gas supply tube 232b. The flow rate of the DCS gas flown through the second gas supply tube 232b is adjusted by the mass flow controller 241b. The DCS gas with the flow rate adjusted, is exhausted from the gas exhaust tube 231 while being supplied into the processing chamber 201 from the gas supply hole 250a of the first nozzle 249a via the first gas supply tube 232a. At this time, simultaneously the valve 243d is opened, and the inactive gas such as N$_2$ gas is flown through the inactive gas supply tube 232d. The flow rate of the N$_2$ gas flown through the inactive gas supply tube 232d is adjusted by the mass flow controller 241d. The N$_2$ gas with the flow rate adjusted, is exhausted from the gas exhaust tube 231 while being supplied into the processing chamber 201 together with the DCS gas.

At this time, the pressure in the processing chamber 201 is set to be the pressure, for example, within a range of 10 to 1000 Pa by appropriately adjusting the APC valve 244. The supply flow rate of the DCS gas controlled by the mass flow controller 241b is set to be the flow rate, for example within a range of 100 to 5000 sccm. The time for exposing the DCS gas to the wafer 200, namely the gas supply time (irradiation time) is set to be the time, for example within a range of 2 to 120 seconds. At this time, the temperature of the heater 207 is set, so that the temperature of the wafer 200 is set to be, for example, within a range of 300 to 600° C.

By the supply of the DCS gas, the third layer containing silicon, being the first element, is formed on the SiN film formed in the first film forming step. Namely, the silicon layer (Si layer), being the silicon-containing layer from less than 1 atomic layer to several atomic layers is formed on the wafer 200 (on the base film). The silicon-containing layer may be the chemical adsorption (surface adsorption) layer of DCS. Note that silicon is the element which becomes solid by itself. Here, the silicon layer includes the continuous layer and the discontinuous layer made of silicon, and also includes the thin film formed by overlapping of these layers. Note that the continuous layer made of silicon is also called the thin film in some cases. Further, the chemical adsorption layer of DCS includes a continuous chemical adsorption layer of DCS molecules and also includes a discontinuous chemical adsorption layer thereof. Note that when the thickness of the silicon-containing layer formed on the wafer 200 exceeds several atomic layers, an action of nitriding in the step 23 as will be described later does not reach the whole body of the silicon-containing layer. Moreover, a minimal value of the silicon-containing layer that can be formed on the wafer 200 is less than 1 atomic layer. Therefore, the thickness of the silicon-containing layer is preferably set to be a value from less than 1 atomic layer to several atomic layers. Note that the layer to be formed can be adjusted by adjusting the conditions of the temperature of the wafer 200 and the pressure in the processing chamber 201, so that the silicon layer is formed by deposition of silicon on the wafer 200 under the condition that the DCS gas is self-decomposed, and the chemical adsorption layer of DCS is formed by chemical adsorption of HCD on the wafer 200 under the condition that the DCS gas is not self-decomposed. Note that the film forming rate can be set to be high in a case of forming the silicon layer on the wafer 200, compared with a case of forming the chemical adsorption layer of DCS on the wafer 200. Meanwhile, a finer layer can be formed in a case of forming the silicon layer on the wafer 200, compared with a case of forming the chemical adsorption layer of DCS on the wafer 200.

<Step 22>

In step 22 (sixth step), after the silicon-containing layer is formed, the valve 243b is closed, to thereby stop the supply of the DCS gas. At this time, the inside of the processing chamber 201 is vacuum-exhausted by the vacuum pump 246, with the APC valve 244 of the gas exhaust tube 231 opened, and unreacted DCS gas or the DCS gas after contributing to forming the silicon-containing layer remained in the processing chamber 201 is removed from the processing chamber 201. Note that the supply of the N$_2$ gas into the processing chamber 201 is maintained, with the valve 243d at this time opened. Thus, it is possible to increase an effect of removing from the processing chamber 201, the unreacted DCS gas or the DCS gas after contributing to forming the silicon-containing layer remained in the processing chamber 201. As the inactive gas, rare gases such as Ar gas, He gas, Ne gas, and Xe gas can be used, other than N$_2$ gas.

<Step 23>

In step 23, after the residual gas in the processing chamber 201 is removed, the valve 243c of the third gas supply tube 232c is opened, to thereby flow the NH$_3$ gas into the third gas supply tube 232c (seventh step). The flow rate of the NH$_3$ gas flown through the third gas supply tube 232c is adjusted by the mass flow controller 241c. The NH$_3$ gas whose flow rate is adjusted is supplied into the buffer chamber 237 from the gas supply hole 250b of the second nozzle 249b. At this time, high frequency power is applied between the first rod electrode 269 and the second rod electrode 270 from the high frequency power source 273 via the matching device 272, to thereby make the NH$_3$ gas supplied into the buffer chamber 237 subjected to plasma-excitation, and the NH$_3$ gas thus subjected to plasma-excitation is exhausted from the gas exhaust tube 231 while being supplied into the processing chamber 201 from the gas supply hole 250c as active species. At this time, simultaneously the valve 243e is opened, and the N$_2$ gas is flown through the inactive gas supply tube 232e. The N$_2$ gas is exhausted from the gas exhaust tube 231 while being supplied into the processing chamber 201 together with the NH$_3$ gas.

When the NH$_3$ gas is plasma-excited and is flown as the active species, the pressure in the processing chamber 201 is set to be the pressure, for example, within a range of 10 to 100 Pa by appropriately adjusting the APC valve 244. The supply flow rate of the NH$_3$ gas controlled by the mass flow controller 241c is set to be the flow rate, for example, within a range of 1000 to 10000 sccm. The time for exposing the wafer 200 to the active species obtained by plasma-exciting the NH$_3$ gas, namely a gas supply time (irradiation time) is set to be the time, for example, within a range of 2 to 120 seconds. In the same way as step 11, the temperature of the heater 207 at this time is set, so that the temperature of the wafer 200 falls within a range of 300 to 600° C. Note that the high frequency power applied between the first rod electrode 269 and the second rod electrode 270 from the high frequency power source 273 is set to be the power, for example, within a range of 50 to 1000 W. The NH$_3$ gas has a high reaction temperature, and is hardly reacted at the aforementioned wafer temperature and under the aforementioned pressure in the processing chamber. Therefore, the NH$_3$ gas is plasma-excited and is then flown as the active species, and therefore the temperature of the wafer 200 may be remained to be in a low temperature range as described above. Note that it is also possible to thermally activate the NH$_3$ gas with non-plasma, without plasma-excitation when the NH$_3$ gas is supplied, by setting the temperature of the wafer 200 to be, for example 600° C. or more by appropriately adjusting the temperature of the heater 207, and by setting the pressure in the processing chamber 201 to be, for example within a range of 50 to 3000 Pa by appropriately adjusting the APC valve 244. Note that when the $NH_3$ gas is thermally activated and supplied, a soft reaction can be generated.

At this time, the gas flown through the processing chamber 201 is the active species obtained by plasma-exciting the $NH_3$ gas, or the $NH_3$ gas thermally activated by increasing the pressure in the processing chamber 201, and the DCS gas is not flown through the processing chamber 201. Accordingly, the $NH_3$ gas does not cause the vapor phase reaction, and the $NH_3$ gas turned to the active species, or the activated $NH_3$ gas, reacts with a part of the silicon-containing layer, being the first layer, formed on the wafer 200 in step 21. Thus, the silicon-containing layer is nitrided, and is modified to a second layer containing silicon (first element) and nitrogen (second element), namely, modified to a silicon-nitride layer (SiN layer).

<Step 24>

Thereafter, the valve 243c of the third gas supply tube 232c is closed, to stop the supply of the $NH_3$ gas. At this time, the inside of the processing chamber 201 is vacuum-exhausted by the vacuum pump 246, with the APC valve 244 of the gas exhaust tube 231 opened, and the unreacted $NH_3$ gas or the $NH_3$ gas after contributing to nitriding, remained in the processing chamber 201 is removed from the processing chamber 201. Note that the supply of the $N_2$ gas into the processing chamber 201 is maintained, with the valve 243c opened. Thus, it is possible to increase the effect of the unreacted $NH_3$ gas or the $NH_3$ gas after contributing to nitriding, remained in the processing 201.

As the nitrogen-containing gas, it is possible to use the gas obtained by exciting the $N_2$ gas, $NF_3$ gas, and $N_3H_8$ gas by plasma and heat, other than the gas obtained by exciting the $NH_3$ gas by plasma and heat, or it is also possible to use the gas obtained by diluting the aforementioned gases with rare gases such as Ar gas, He gas, Ne gas, and Xe gas.

With the aforementioned steps 21 to 24 set as one cycle, and by repeating this cycle at least once or more, the second thin film containing silicon (first element) and nitrogen (second element) of a prescribed film thickness, namely, the second SiN film can be formed on the wafer 200. Note that the aforementioned cycle is preferably repeated multiple numbers of times. Thus, the second film forming step is ended.

When the film forming process of forming the first SiN film and the second SiN film of prescribed film thickness is performed, the inside of the processing chamber 201 is purged with inactive gas by exhausting the inactive gas such as $N_2$ gas from the processing chamber 201 while supplying it into the processing chamber 201 (gas purge). Thereafter, the atmosphere in the processing chamber 201 is substituted by the inactive gas (inactive gas substitute), and the pressure in the processing chamber 201 is returned to a normal pressure (returned to an atmospheric pressure).

Thereafter, the seal cap 219 is descended by the boat elevator 115, to open the lower end of the reaction tube 203 and also unload the processed wafer 200 to outside of the reaction tube 203 from the lower end of the reaction tube 203 in a state of being supported by the boat 217 (boat unloading). Thereafter, the processed wafer 200 is discharged from the boat 217 (wafer discharge).

Thus, the first SiN film (initial SiN film) can be formed on the surface of the wafer 200 by using the HCD gas and the $NH_3$ gas, and the second SiN film can be formed on the first SiN film by using the DCS gas and the $NH_3$ gas.

Figure 5:
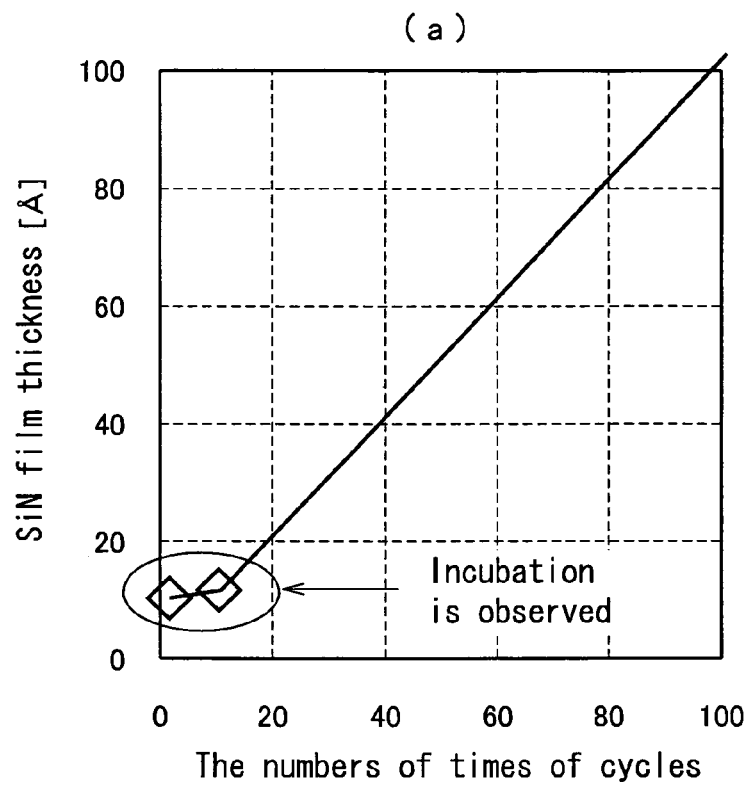
FIG. 5 is a view showing a relation between the number of times of cycles of film formation and an average film thickness, according to the first embodiment of the present invention.
Figure 5:
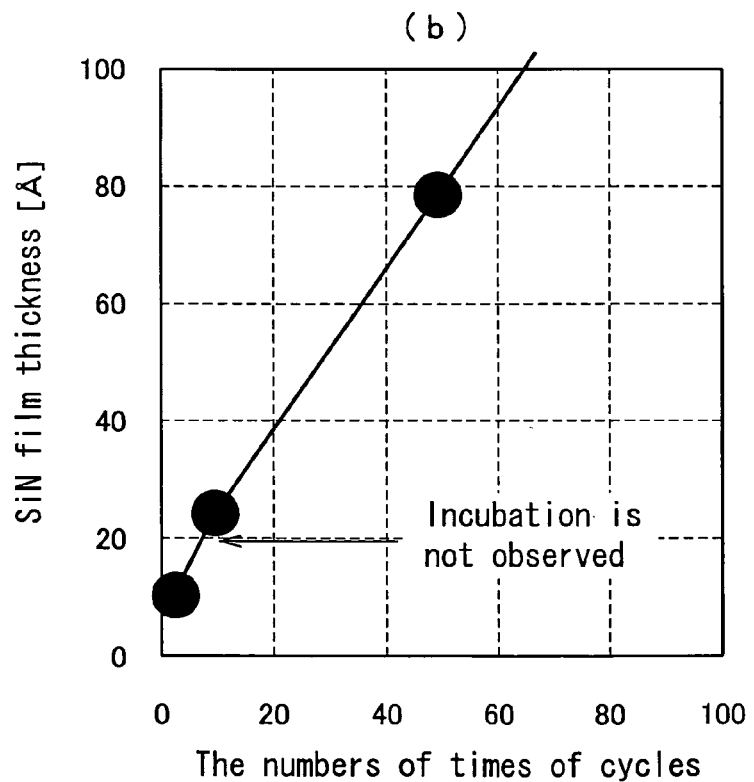

Here, FIG. 5A shows a relation between the number of times of cycles and an average film thickness, when the SiN film (second SiN film) is formed by using the DCS gas for the gas containing Si as a weak reactive gas. FIG. 5B shows a relation between the number of times of cycles and the average film thickness, when the SiN film (first SiN film) is formed by using the HCD gas for the gas containing Si as a strong reactive gas. The horizontal axis shows the number of times of cycles of each film forming step, and the vertical axis shows the film thickness of the formed SiN film. When the DCS gas is used, an influence of a base surface state is easily received, due to its low reactivity, and the film forming step includes an incubation time. When the HCD gas is used, the influence of the base surface state is hardly received due to its high reactivity, thereby increasing and the film thickness of the silicon-containing layer, being the silicon layer (Si layer) or the chemical adsorption layer (surface adsorption layer) of the HCD gas, formed on the wafer 200 (on the base film). As a result, film formation is performed without the incubation time, and regarding the film thickness of the SiN film formed per 1 cycle, the film thickness by using the HCD gas is greater than the film thickness by using the HCD gas. Thus, by forming the second SiN film (the second thin film) by using the DCS gas after forming the first SiN film (the first thin film) by using the HCD gas, the SiN film can be formed without the incubation time.

Further, although the film forming rate is faster in a case of using the HCD gas, a surface roughness of the formed SiN film is more excellent in a case of using the DCS gas. The reason therefore is considered as follows. A DCS molecule is constituted of one Si atom and two H atoms and two Cl atoms, and a HCD molecule is constituted of two Si atoms and 6 Cl atoms. If both molecules are compared, the DCS molecule includes one Si atom, and the HCD molecule includes two Si atoms. Therefore, the HCD molecule includes Si of a quantity of twice the quantity of the DCS molecule, and if Si remains on the substrate surface, Si is considered to be formed into an island shape. Accordingly, by forming the second SiN film by using DCS after forming the first SiN film by using the HCD gas, it is possible to prevent the SiN film from being formed into the island shape, and the film quality on a lamination interface can be improved and controlled.

Figure 6:
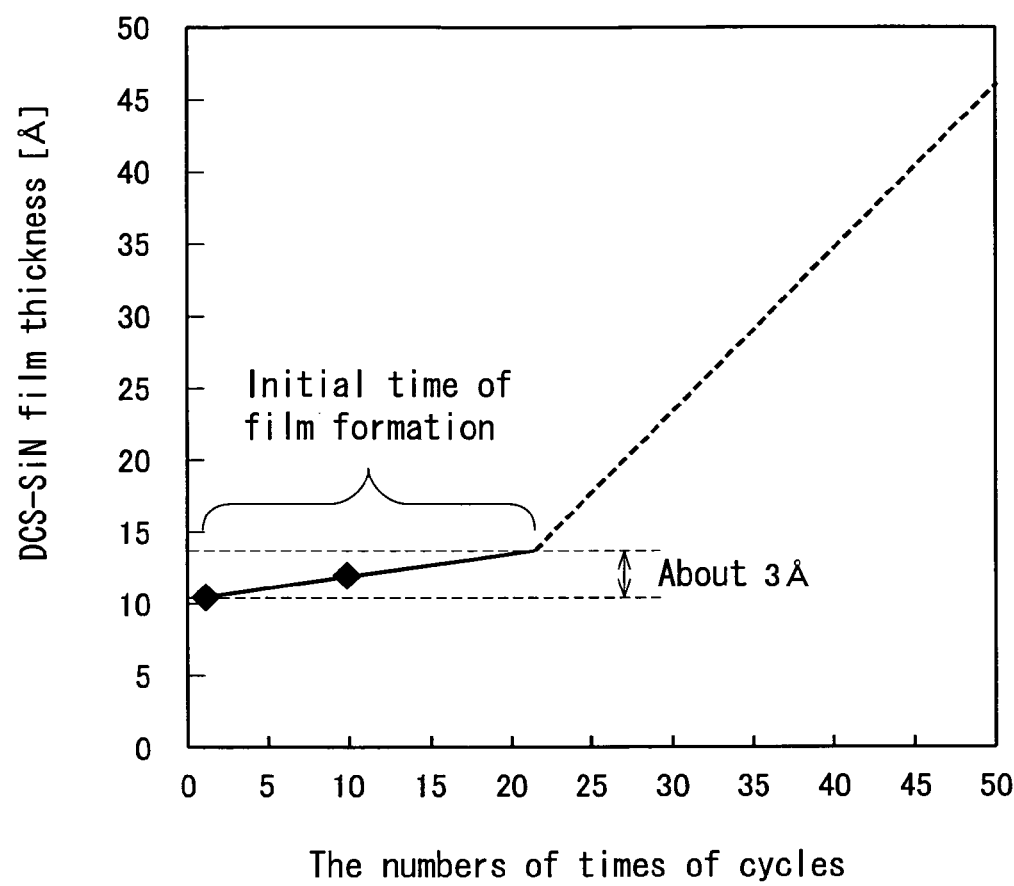
FIG. 6 is a view showing details of FIG. 5.

Further, the film thickness required for the first SiN film formed by using the HCD gas is examined. The relation between the number of times of cycles and the film thickness of the SiN film at the initial time of forming the second SiN film by supplying the DCS gas, and the relation between the number of times of cycles and the film thickness of the SiN film after sufficiently forming the second SiN film by supplying the DCS gas, is different from each other. FIG. 6 shows an expanded view of a part of the number of times of cycles up to 50 times. As clarified from FIG. 5, in a case of the film forming step including the incubation time, the relation between the number of times of cycles and the film thickness is changed from a part where the film thickness of the second SiN film is increased by about 3 Å by supplying the DCS gas. Therefore, it can be considered that 3 Å or more is suitable for the film thickness of the HCD-SiN film formed, with the first SiN film as a base, by supplying the HCD gas without incubation. Thus, if the second SiN film is formed by supplying the HCD gas, with a film thickness of at least 3 Å or more, it can be formed, with the HCD-SiN film as a base without incubation, and therefore it is further possible to form the SiN film without the incubation time.

Further, according to this embodiment, the HCD gas and the DCS gas are supplied from the nozzle 240a which is the nozzle in common. This makes it possible to simplify the structure.

Figure 7:
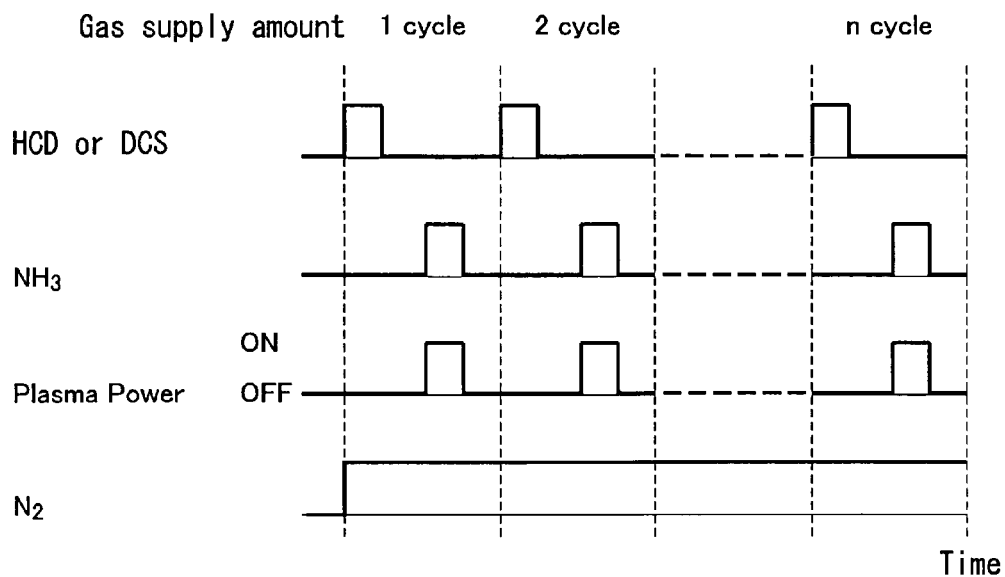
FIG. 7 is a sequence view at the time of supplying each gas at each processing temperature of the film forming step, according to the first embodiment of the present invention.
Figure 7:
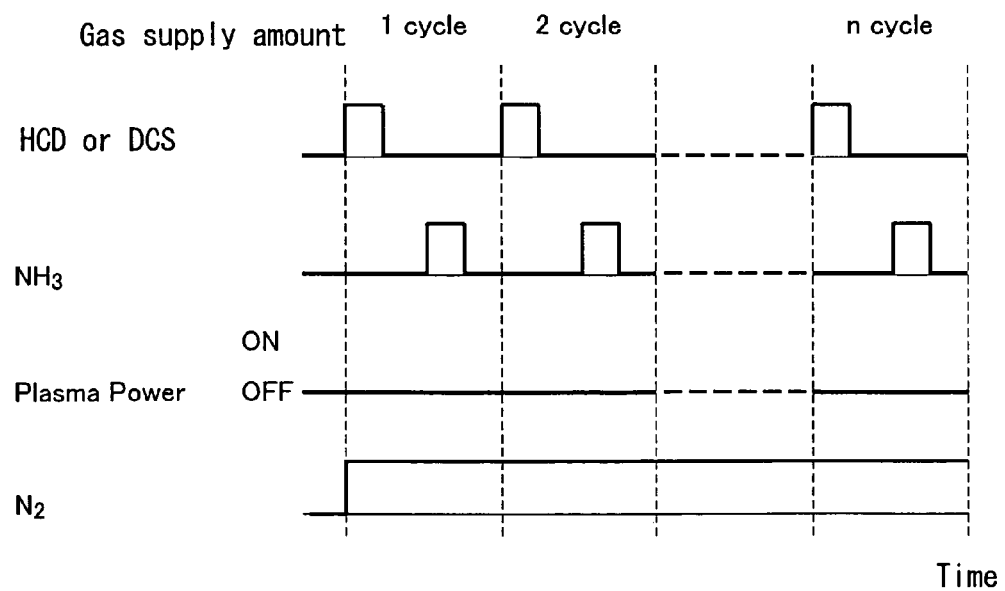

Further, FIG. 7 shows a sequence view of the film forming step in which an excitation method of the $NH_3$ gas is different at each processing temperature. FIG. 7A is a sequence view of a case in which the temperature of the wafer 200 is set to be 300 to 600° C. In this case, when the $NH_3$ gas is supplied, the $NH_3$ gas is used in a state of being activated by plasma. FIG. 7B is a sequence view of a case in which the temperature of the wafer 200 is set to be 600° C. or more. In this case, since the $NH_3$ gas is activated by a thermal energy, plasma-excitation is not performed. In these cases, it is preferable that the inactive gas such as $N_2$ gas is continuously supplied to the processing furnace 202.

Note that here, explanation has been given for an example of forming the SiN film by using the HCD gas as the first processing gas, and the DCS gas as the third processing gas. However, the present invention is not limited to the aforementioned example, and can be variously modified in a range not departing from the gist of the present invention. A combination of other gases is possible, provided that the first processing gas has a higher reactivity (thermal decomposition property) than the third processing gas, and the gas is the kind not having the incubation time. As the silicon-containing gas, other than the HCD gas and the DCS gas, not only an inorganic source such as tetrachlorosilane ($SiCl_4$, abbreviated as TCS) gas and monosilane ($SiH_4$) gas, but also an organic source such as amino silane-based tetrakisdimethylaminosilane (($Si(N(CH_3)_2))_4$, abbreviated as 4DMAS) gas, tris(dimethylamino)silane (($Si(N(CH_3)_2))_3H$, abbreviated as 3DMAS) gas, bis diethyl aminosilane ($Si(N(C_2H_5)_2)_2H_2$, abbreviated as 2DEMA) gas, and bis tertiary-butylamino silane ($SiH_2(NH(C_4H_9))_2$, abbreviated as BTBAS) gas, may be used.

In addition, in the step 13 in the first film forming step and/or the step 23 in the second film forming step, a nitriding reaction of the silicon-containing layer may be turned to a non-saturated state. For example, when the silicon layer of several atomic layers is formed in the step 11 and/or the step 21, at least a part of its surface layer (1 atomic layer of the surface) is nitrided. Namely, a part of the surface layer or the whole part thereof is nitrided. In this case, the silicon layer is nitrided under the condition in which the nitriding reaction of the silicon layer is set in the non-saturated state, so that the whole body of the silicon layer of several atomic layers is not nitrided. Note that it is also possible to nitride the silicon layer of several atomic layers from a surface layer to several lower layers, depending on the condition. However, nitriding of only the surface layer is preferable, because controllability of a composition ratio of the silicon nitride film can be improved. Further, for example in the step 11 and/or the step 21, when the silicon layer of 1 atomic layer or less than 1 atomic layer is formed, a part of the silicon layer is nitrided. In this case also, the silicon layer is nitrided under the condition in which the nitriding reaction of the silicon layer is set in the non-saturation state. Note that nitrogen is the element which does not become solid by itself.

At this time, the pressure, or the pressure and the gas supply time in the processing chamber 201 in the step 11 and/or the step 21 is set to be larger or longer than the pressure, or the pressure and the gas supply time in the processing chamber 201 in the step 11 and/or the step 21 in a case of forming the SiN film having a stoichiometric composition. Thus, by controlling the processing condition in this way, a supply amount of silicon in the step 11 and/or the step 21 is more excessively set than a case of forming the SiN film having the stoichiometric composition. Then, by such an excessive supply of silicon in the step 11 and/or the step 21, the nitriding reaction of the silicon-containing layer in the step 13 and/or the step 23 is not set in the saturated state. Namely, the number of silicon atoms given in the step 11 and/or the step 21 is made more excessive than the case of forming the silicon nitride film having the stoichiometric composition, and thus the nitriding reaction of the silicon-containing layer in the step 13 and/or the step 23 is suppressed. Thus, the composition ratio of the silicon nitride film (SiN film) is controlled so that silicon (Si) is more excessive than nitrogen (N), in the stoichiometric composition.

Alternatively, the pressure, or the pressure and the gas supply time in the processing chamber 201 in the step 13 and/or the step 23 is set to be smaller or shorter than the pressure, or the pressure and the gas supply time in the processing chamber 201 in the step 13 and/or the step 23 in a case of forming the silicon nitride film having the stoichiometric composition. Thus, by controlling the processing condition, the supply amount of the nitrogen in the step 13 and/or the step 23 is made more insufficient than the case of forming the silicon nitride film having the stoichiometric composition. Then, due to insufficient supply of the nitrogen in the step 13 and/or the step 23, the nitriding reaction of the silicon-containing layer in step 13 is set in the non-saturated state. Namely, the number of nitrogen atoms given in the step 13 and/or the step 23 is made insufficient more than the case of forming the silicon nitride film having the stoichiometric composition, and thus the nitriding reaction of the silicon-containing layer in the step 13 and/or the step 23 is suppressed. Thus, the composition ratio of the silicon nitride film (SiN film) is controlled so that silicon (Si) is more excessive than nitrogen (N) in the stoichiometric composition.

Second Embodiment

Figure 8:
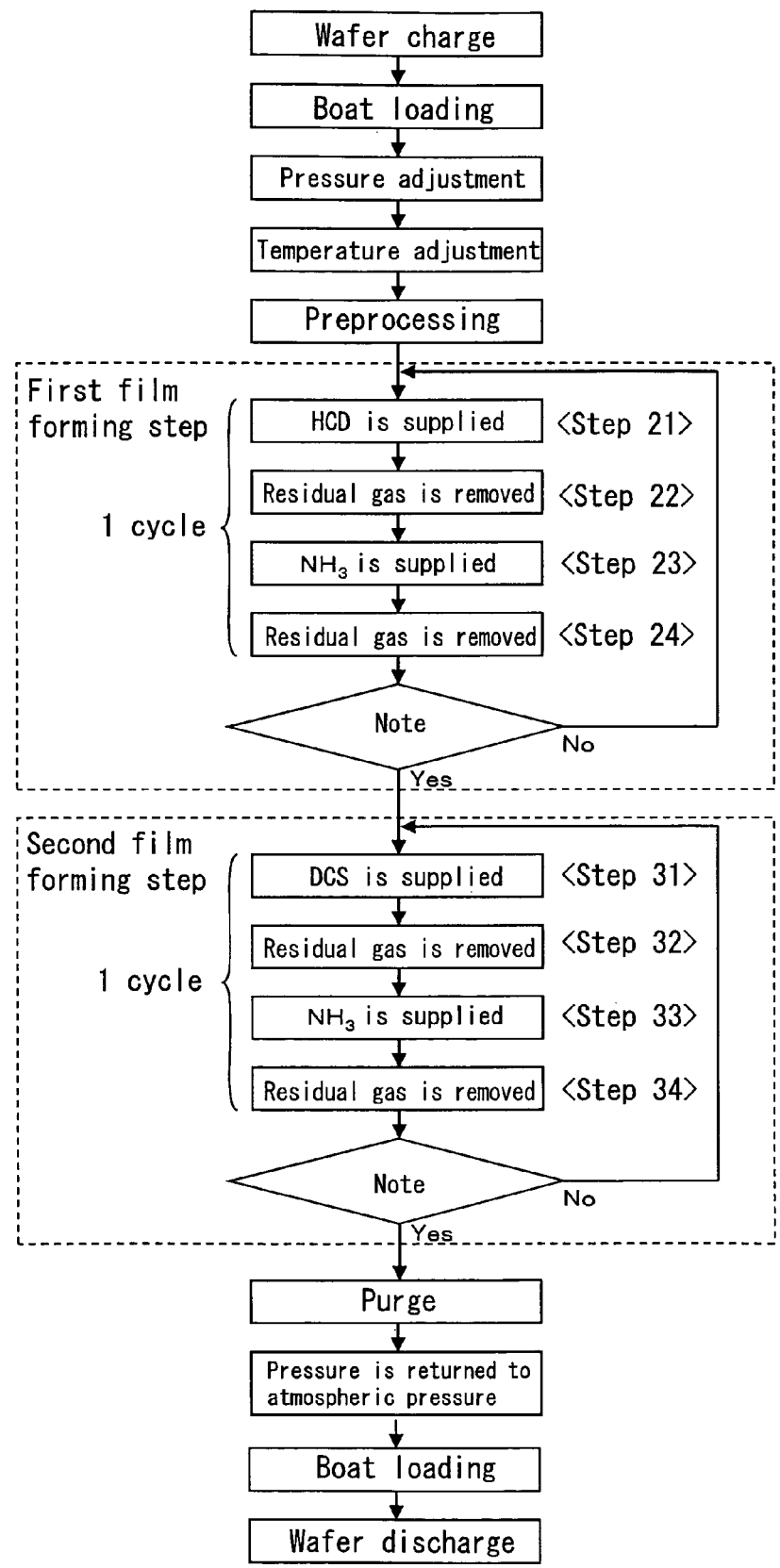
FIG. 8 is a flowchart explaining the process according to a second embodiment of the present invention.

In this embodiment, explanation will be given for an example of performing preprocessing (modifying step), before performing the film forming step of forming the SiN film on the substrate, to suppress the generation of the incubation time of the film forming step. FIG. 8 is a flowchart for explaining a process in this embodiment. The substrate processing apparatus in this embodiment is the same apparatus as the substrate processing apparatus explained in the first embodiment, and the preprocessing step is preferably performed in the same processing chamber.

A plurality of wafers 200 are charged into the boat 217 (wafer charge), and loaded into the processing chamber 201 (boat loading), then the pressure in the processing chamber 201 is adjusted to a prescribed pressure, and the temperature of the inside of the processing chamber is adjusted to have a prescribed temperature distribution. Thereafter, the next preprocessing step is executed.

In the preprocessing step (modifying step), the $NH_3$ gas is flown as a modifying gas. An object of the preprocessing is to clarify (modify) the surface of the wafer 200, and prepare an environment in which Si is easily deposited on the surface of the wafer 200, or Si-containing gas is easily adsorbed on the surface of the wafer 200. To clarify (modify) the surface of the wafer 200 is to remove a natural oxide film or a contaminated material that exists at least on the surface of the wafer.

The $NH_3$ gas, with the flow rate adjusted by the mass flow controller 241c from the third gas supply tube 232c, is injected into the buffer chamber 237 from the gas supply hole 250b of the second nozzle 249b, by opening both of the valve 243c formed in the third gas supply tube 232c, and the APC valve 244 formed in the gas exhaust tube 231, then $NH_3$ is plasma-excited by applying high frequency electric power between the first rod electrode 269 and second rod electrode 270 via the matching device 272 from the high frequency power source 273, and the $NH_3$ thus plasma-excited is exhausted from the gas exhaust tube 231 while being supplied into the processing furnace 202 from the gas supply hole 250c as the active species. When the $NH_3$ gas is plasma-excited and is flown as the active species, the APC valve 244 is appropriately adjusted, to thereby set the pressure in the processing furnace 202 to 50 Pa. The supply flow rate of the $NH_3$ gas controlled by the mass flow controller 241c is in a range of 100 sccm to 10000 sccm (preferably 1000 to 10000 sccm). The time for exposing the wafer 200 to the active species obtained by performing plasma-excitation of the $NH_3$ gas, is in a range of 2 to 120 seconds. The temperature of the heater 207 at this time is set so that the wafer 200 has the temperature in a range of 300 to 600° C.

The $NH_3$ gas has a high reaction temperature, and therefore is hardly reacted at the temperature of the heater 207 and under the pressure in the processing furnace 202, and therefore is flown after being activated by plasma excitation. Accordingly, the temperature of the wafer can be kept in an already set low temperature range. At this time, the preprocessing temperature is the same temperature as the film forming temperature as will be described later. One of the reasons therefore is that in a case of a vertical apparatus, if the temperature of the preprocessing step is increased, time is required for decreasing the temperature in the film forming step which is performed later, but such a state can be prevented.

Further, when the temperature of the heater 207 is set so that the temperature of the wafer 200 becomes 600° C. or more, energy required for activating the $NH_3$ gas can be obtained as a thermal energy, and therefore the plasma-excitation may not be performed when the $NH_3$ gas is supplied. In this case, by setting the pressure in the processing furnace 202 to a value higher than 50 Pa at the time of plasma-excitation by appropriately adjusting the APC valve 244, the $NH_3$ gas can be activated. Note that a soft reaction can be caused by supplying the $NH_3$ gas after being activated by heat, and soft nitriding processing in the film forming step is possible.

When the preprocessing is thus performed, the $NH_3$ gas is continuously supplied. Further, the inactive gas such as $N_2$ is preferably supplied continuously to the processing furnace 202. By this preprocessing step, the $NH_3$ gas turned to the active species is reacted with the surface of the wafer 200, to modify the surface of the wafer, thus preparing an environment in which Si is easily deposited on the surface of the wafer 200, or Si-containing gas is easily adsorbed on the surface of the wafer 200.

After the surface of the wafer 200 is modified, the valve 243c of the third gas supply tube 232c is closed, to stop the supply of the $NH_3$ gas. Further, the processing furnace 202 is exhausted to 20 Pa or less by the vacuum pump 246, with the APC valve 244 of the gas exhaust tube 231 opened, and the residual $NH_3$ gas is removed from the processing furnace 202. Moreover, when the inactive gas such as $N_2$ is supplied to the processing furnace 202, the effect of removing the residual $NH_3$ gas is further increased.

Thus, in the preprocessing (modifying) step of this embodiment, by supplying the active species generated by plasma-excitation of the gas containing nitrogen such as $NH_3$ gas to the surface of a base, the surface of the base can be cleaned and the natural oxide film or the contaminated material can be removed. Further, the Si layer of the base can be modified into the SiN film. Accordingly, it is extremely useful to perform such a preprocessing step, before the SiN film is formed. Particularly, in this embodiment in which the preprocessing step and the film forming step can be performed in the same processing chamber, the surface of the base, which is subjected to the preprocessing, is not re-contaminated, and therefore the generation of the incubation time after the film forming step thereafter can be suppressed. As a result, nucleus formation in the initial process of the film formation is omitted, and there is no difference between the film formed in the initial process and the film formed thereafter, thus making it possible to improve the film quality of the interface.

Note that the film forming step may include two stages of forming the first SiN film by performing the first film forming step by using the HCD gas and the $NH_3$ gas, and thereafter forming the second SiN film by performing the second film forming step by using the DCS gas and the $NH_3$ gas, or may include only one of them. Namely, the SiN film may be formed until a prescribed film thickness is obtained by using the HCD gas and the $NH_3$ gas after the preprocessing step, or the SiN film may be formed until a prescribed film thickness is obtained by using the DCS gas and the $NH_3$ gas after the preprocessing.

Third Embodiment

In this embodiment, explanation will be given for an embodiment wherein when the film formation is performed by using the HCD gas in the first film forming step of the first embodiment, the film thickness of the SiN film per one cycle can be controlled by changing the supply condition of the HCD gas, and further post-processing step (modifying step) is performed after the film forming step.

The supply condition of the HCD gas includes any one of the time, flow rate, and pressure. Further, the $NH_3$ gas, being the nitrogen-containing gas, can be activated by heat and supplied to the processing chamber 201. However, it is preferable that the $NH_3$ gas is plasma-excited and is then supplied to the processing chamber 201.

In the first film forming step of forming the SiN film on the wafer 200 by using the HCD gas and the $NH_3$ gas, the film thickness of the Si film formed per one cycle is controlled to a desired value by changing the supply condition of the HCD gas.

Further, after the SiN film is formed on the wafer 200 by performing the film forming step, by supplying the gas activated by plasma-excitation, for example, the active species of the $NH_3$ gas, to the wafer 200, the SiN film formed on the wafer 200 can be modified. The film forming process and the modifying process are set as one cycle, and by repeating this cycle prescribed numbers of times, the SiN film formed per one cycle can be made thick, compared with a case of not performing the modifying process. In the film forming process and the modifying process, the temperature in the processing chamber 201 is preferably set to the same temperature by controlling the heater 207. The same temperature with the temperature of the film forming process is possible, by using the active species obtained by plasma-excitation, as the gas used in the modifying process.

Figure 9:
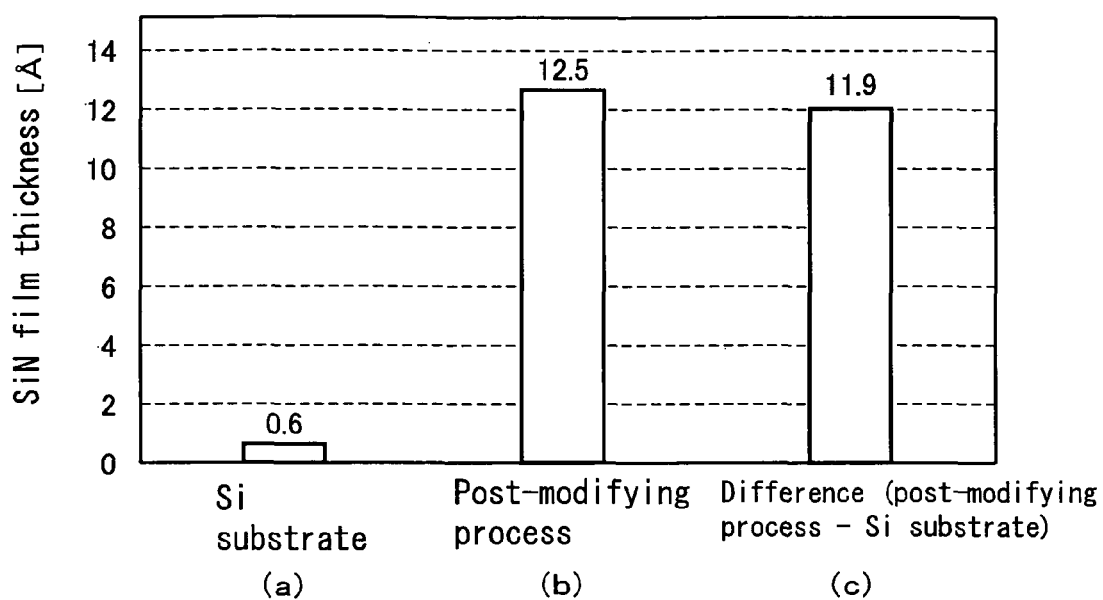
FIG. 9 shows a result of measuring a film thickness of a SiN film formed on a silicon (Si) wafer, according to a third embodiment of the present invention.

FIG. 9 shows a result of measuring the film thickness of the SiN film formed on a silicon (Si) wafer 200. FIG. 9A shows the film thickness of the Si film in a case of not performing the modifying process of the surface of the wafer 200, and FIG. 9B shows the film thickness of the SiN film obtained in a case of performing the modifying process by using the plasma-excitation after the Si film is formed on the surface of the wafer 200, and FIG. 9C shows the difference between FIG. 9A and FIG. 9B, being the difference between the film thicknesses obtained by presence/absence of the modifying process. From FIG. 9, it is found that the Si layer is modified to the SiN layer having thickness of about 12 Å, by the active species obtained by the plasma-excitation of the $NH_3$ gas. When the reactive gas having high reactivity such as HCD gas is used, the film thickness of the Si film formed per one cycle can be controlled up to about 1 to 5 Å, by changing the supply conditions (supply time, supply flow rate, and supply pressure) of the HCD gas. Therefore, when the active species obtained by performing plasma-excitation of the $Nh_3$ gas is flown after the Si film of about 5 Å is formed, the SiN film of about 10 Å per one cycle can be formed. As the film thickness of the SiN film formed per one cycle is thicker, the number of sheets of the semiconductor substrates that can be processed per unit time is increased, which directly linked to an improvement of the productivity in this embodiment.

Further, in the film forming step, when the $NH_3$ gas is activated by plasma-excitation and is supplied, the composition ratio of the SiN film is approximately Si/N=3/4. Meanwhile, when the $NH_3$ gas is activated by heat and is supplied, the composition ratio of the SiN film can be easily controlled, and for example the SiN film can be formed into a SiRN (Silicon Rich Nitride) film with much Si atoms.

Figure 10:
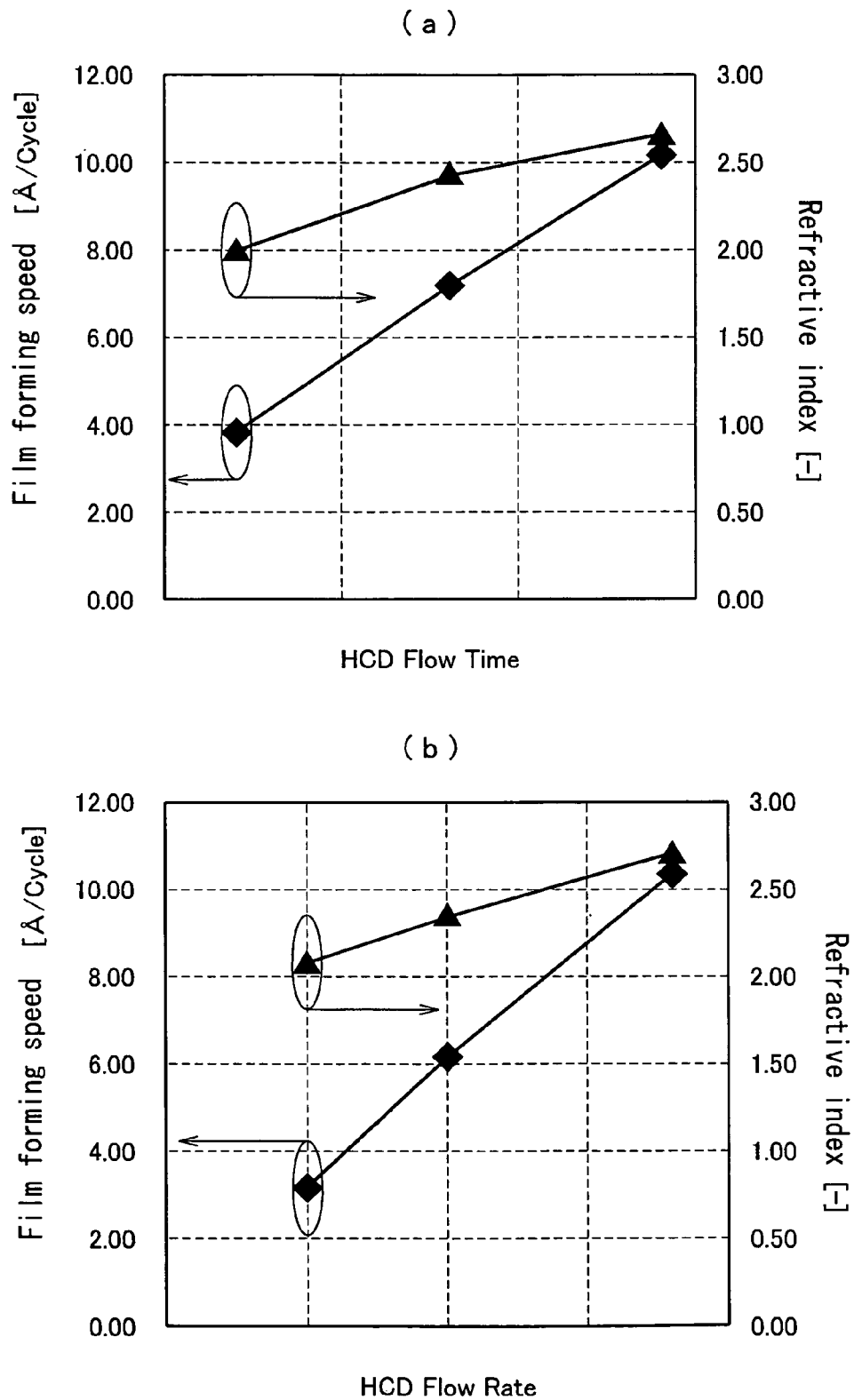
FIG. 10 shows a relation among supply time and supply rate of HCD gas, a film thickness, and a refraction index, according to the third embodiment of the present invention.

Further, the relation among the supply time and supply rate of the HCD gas, a film thickness supplied into the processing chamber, and the refractive index is as follows. The quantity of Si contained in the SiN film has a tendency of increase by extending the supply time of the HCD gas, being a Si source in the SiN film. Further, the quantity of Si has also similarly the tendency of increase by increasing the supply rate of the HCD gas. FIG. 10 shows data showing these relations. FIG. 10A shows the relation between the supply time and film forming speed of the HCD gas (♦), and the refractive index (▲), wherein the horizontal axis indicates the supply time of the HCD gas, and the left vertical axis indicates the film forming speed of the SiN film, and the right vertical axis indicates the value of the refractive index of the SiN film. Further, FIG. 10B shows the relation between the supply rate and the film forming speed of the HCD gas (♦), and the refractive index (▲), wherein the horizontal axis indicates the supply rate of the HCD gas, and the left vertical axis indicates the film forming speed of the formed SiN film, and the right vertical axis indicates the value of the refractive index of the formed SiN film. The refractive index of the SiN film alone is higher than the refractive index 2.0 of SiN, and therefore the increase of the quantity of Si in the SiN film appears as the increase of the refractive index. The increase of the quantity of Si leads to the increase of the SiN film formed per one cycle, and therefore by increasing the quantity of Si, the film forming speed can be improved.

Note that the film forming step of this embodiment may include two stages of forming the first SiN film by performing the first film forming step by using the HCD gas and the $NH_3$ gas, and thereafter forming the second SiN film by performing the second film forming step by using the DCS gas and the $NH_3$ gas, or may include only one of them. Namely, the modifying step may be performed after the film forming step of forming the SiN film on the wafer 202 by using the HCD gas and the $NH_3$ gas, or the modifying step may be performed after the film forming step of forming the SiN film on the wafer 202 by using the DCS gas and the $NH_3$ gas.

Further, the present invention can be variously modified and executed, and therefore the range of the present invention is not limited to the aforementioned embodiments and examples, and the first embodiment, the second embodiment, and the third embodiment may be respectively combined. Moreover, in any one of the first to third embodiments, a plurality of sheets of substrates are simultaneously processed, by using the vertical apparatus having the processing chamber for storing a plurality of wafers in a state of lamination. However, the present invention can be applied to a case of performing a sheet processing of processing one or two to three sheets by using a single wafer processor having a storage chamber for storing one or two to three sheets of wafers. Namely, the range of the present invention is defined by claims, and all changes within the scope of the claims and equivalent thereto are incorporated in the claims.

Preferable aspects of the present invention will be additionally described hereinafter.

(Additional Description 1)

According to the present invention, a manufacturing method of a semiconductor device is provided, including the steps of:

forming a first thin film on a surface of a substrate placed in a processing chamber by performing a first film forming step; and forming a second thin film having the same element component as the first thin film on the first thin film by performing a second film forming step, wherein the first film forming step includes:

a first step of supplying a first processing gas containing a first element into the processing chamber;

a second step of exhausting the first processing gas remained in the processing chamber;

a third step of supplying a second processing gas containing a second element into the processing chamber; and a fourth step of exhausting the second processing gas remained in the processing chamber, wherein the first thin film is formed on the surface of the substrate, with the first to fourth steps set as one cycle and by repeating this cycle prescribed numbers of times, the second film forming step includes:

a fifth step of supplying a third processing gas containing the first element and having an element component which is different from that of the first processing gas;

a sixth step of exhausting the third processing gas remained in the processing chamber;

a seventh step of supplying the second processing gas containing the second element into the processing chamber; and an eighth step of exhausting the second processing gas remained in the processing chamber, wherein the second thin film is formed on the first thin film, with the fifth to eighth steps set as one cycle and by repeating this cycle prescribed numbers of times.

(Additional Description 2)

Preferably, the first processing gas is the processing gas capable of depositing the film by itself, and the second processing gas is the processing gas not capable of depositing the film by itself.

(Additional Description 3)

Preferably, the first processing gas has a higher thermal decomposition property than that of the second processing gas.

(Additional Description 4)

Preferably, the first element is silicon, and the first processing gas is hexachloro silane, and the second processing gas is dichloro silane.

(Additional Description 5)

Preferably, the second element is nitrogen, and the third processing gas is any one of ammonia, nitrogen fluoride, and $N_3H_8$, and the first thin film and the second thin film are silicon nitride films.

(Additional Description 6)
Preferably, the first thin film is formed to have a film thickness of at least 3 Å or more.
(Additional Description 7)
Preferably, the third processing gas is supplied into the processing chamber before the first film forming step, to thereby perform preprocessing step of removing a natural oxide film or a contaminated material on the surface of the substrate.
(Additional Description 8)
Preferably, the third processing gas is activated by plasma-excitation and used.
(Additional Description 9)
Preferably, temperature of the substrate is 300 to 600° C.
(Additional Description 10)
Preferably, the third processing gas is activated by heat and used.
(Additional Description 11)
Preferably, the temperature of the substrate is 600° C. or more.
(Additional Description 12)
Preferably, the first film forming step, the second film forming step, and the preprocessing step are performed in the same processing chamber.
(Additional Description 13)
Preferably, the first film forming step, the second film forming step, and the preprocessing step are performed by heating the substrate to the same temperature.
(Additional Description 14)
Preferably, the second thin film is modified by supplying the third processing gas activated by plasma-excitation into the processing chamber, after the second film forming step.
(Additional Description 15)
Preferably, in the first film forming step, the film thickness of the film formed by one cycle is controlled by changing a supply condition of the second processing gas.
(Additional Description 16)
According to other aspect of the present invention, a manufacturing method of a semiconductor device is provided, including the steps of:
forming a thin film on a surface of a substrate placed in a processing chamber by performing a film forming step; and thereafter
modifying the thin film by performing a modifying step,
wherein the film forming step includes:
a first step of supplying a first processing gas containing a first element into the processing chamber;
a second step of exhausting the first processing gas remained in the processing chamber;
a third step of supplying a second processing gas containing a second element into the processing chamber; and
a fourth step of exhausting the second processing gas remained in the processing chamber,
wherein the thin film is formed, with the first to fourth steps set as one cycle, and by repeating this cycle prescribed numbers of times,
and the modifying step includes the step of modifying the thin film by supplying the second processing gas activated by plasma-excitation, and the thin film having a prescribed film thickness is formed by repeating the film forming step and the modifying step prescribed numbers of times while maintaining the temperature of the substrate to be constant.
(Additional Description 17)
Preferably, the film forming step is performed in the same processing chamber as the modifying step.

(Additional Description 18)
According to other aspect of the present invention, a manufacturing method of a semiconductor substrate is provided, including:
a first step of supplying a first processing gas into a processing chamber in which a substrate is placed;
a second step of exhausting the first processing gas remained in the processing chamber;
a third step of supplying a second processing gas into the processing chamber; and
a fourth step of exhausting the second processing gas remained in the processing chamber,
wherein a film is formed on the substrate, with these steps set as one cycle and by repeating this cycle prescribed numbers of times, and
in the first step, by changing a supply condition of the first processing gas, a film thickness of a film formed by one cycle is controlled.
(Additional Description 19)
Preferably, the processing condition of the first processing gas includes any one of the time, flow rate, and pressure.
(Additional Description 20)
Preferably, the first processing gas is hexachlorodisilane, and the second processing gas is ammonia, and a film formed on the substrate is a silicon nitride film.
(Additional Description 21)
Preferably, the second processing gas is used in a state of being activated by plasma-excitation.
(Additional Description 22)
According to other aspect of the present invention, a substrate processing apparatus is provided, including:
a processing chamber that accommodates a substrate;
a heating mechanism that heats at least the substrate;
in the processing chamber,
a first processing gas supply system of supplying a first processing gas containing a first element and a second processing gas containing the first element and different from the first processing gas;
a second processing gas supply system of supplying a third processing gas containing a second element into the processing chamber;
an exhaust system that exhausts an atmosphere in the processing chamber; and
a control part that controls the heating mechanism, the first processing gas supply system, the second processing gas system, and the exhaust system,
wherein the control part controls the heating mechanism, the first processing gas supply system, the second processing gas supply system, and the exhaust system, so that the first processing gas and the third processing gas are alternately supplied into the processing chamber while heating at least the substrate to a prescribed temperature, to thereby form a first film, and thereafter the second processing gas and the third processing gas are alternately supplied into the processing chamber, to thereby form a second film, with the first film and the second film having the same element components.
(Additional Description 23)
Preferably, at least a pair of electrodes are provided for generating plasma to excite the third processing gas supplied into the processing chamber by application of electric power, and the third processing gas is activated by plasma-excitation and used.
(Additional Description 24)
According to other aspect of the present invention, a substrate processing apparatus is provided, including:
a processing chamber that accommodates a substrate;
a heating mechanism that heats at least the substrate;

in the processing chamber,
a first processing gas supply system of supplying a first processing gas;
a second processing gas supply system of supplying a second processing gas into the processing chamber;
an exhaust system that exhausts an atmosphere in the processing chamber; and
a control part that controls the heating mechanism, the first processing gas supply system, the second processing gas system, and the exhaust system,
wherein the control part controls the heating mechanism, the first processing gas supply system, the second processing gas supply system, and the exhaust system, so that the first processing gas and the second processing gas are alternately supplied into the processing chamber, to thereby form a film, and thereafter the second processing gas is supplied into the processing chamber, to thereby modify the formed film,
wherein formation of the film and modification of the formed film are performed at the same temperature, and a film forming process and a modifying process are repeated until a prescribed film thickness is obtained.

(Additional Description 25)

Preferably, at least a pair of electrodes are provided for generating plasma to excite the third processing gas supplied into the processing chamber by application of electric power, and the third processing gas is activated by plasma-excitation and used.

(Additional Description 26)

According to other aspect of the present invention, a substrate processing apparatus is provided, including:
a processing chamber that accommodates a substrate;
a heating mechanism that heats at least the substrate;
in the processing chamber,
a first processing gas supply system of supplying a first processing gas containing a first element and a second processing gas containing the first element and different from the first processing gas;
a second processing gas supply system of supplying a third processing gas containing a second element into the processing chamber;
an exhaust system that exhausts an atmosphere in the processing chamber; and
a control part that controls the heating mechanism, the first processing gas supply system, the second processing gas system, and the exhaust system,
wherein a film is formed, with the step of forming the film by alternately supplying the first processing gas and the second processing gas into the processing chamber set as one cycle, and by repeating this cycle prescribed numbers of times,
wherein the film thickness of the film formed by one cycle is controlled by changing a supply condition of the second processing gas.

(Additional Description 27)

According to other aspect of the present invention, a semiconductor device is provided, having the film formed by using the manufacturing method of the semiconductor device according to the (additional description 1) to the (additional description 21).

(Additional Description 28)

According to other aspect of the present invention, a semiconductor device is provided, having a film formed by using the substrate processing apparatus according to the (additional description 22) to the (additional description 26).

What is claimed is:

1. A manufacturing method of a semiconductor device, comprising:
a first film forming step of forming a first thin film on a surface of a substrate placed in a processing chamber; and
a second film forming step of forming a second thin film having the same element component as the first thin film on the first thin film after the first film forming step is performed,
wherein the first film forming step comprises:
a first step of supplying a first processing gas containing a first element into the processing chamber through a buffer chamber, the buffer chamber forming a gas dispersion space for uniformizing flow rat and flow velocity of gas within the buffer chamber;
a second step of exhausting the first processing gas remained in the processing chamber;
a third step of supplying a second processing gas containing a second element into the processing chamber through the buffer chamber; and
a fourth step of exhausting the second processing gas remained in the processing chamber,
wherein the first thin film is formed on the surface of the substrate, with the first to fourth steps set as one cycle and by repeating this cycle prescribed number of times,
the second film forming step comprises:
a fifth step of supplying into the processing, chamber through the buffer chamber, a third processing gas containing the first element, having an element component which is different from that of the first processing gas, and having a lower thermal decomposition property than that of the first processing gas;
a sixth step of exhausting the third processing gas remained in the processing chamber;
a seventh step of supplying the second processing gas containing the second element into the processing chamber through the buffer chamber; and
an eighth step of exhausting the second processing gas remained in the processing chamber,
wherein the second thin film is formed on the first thin film, with the fifth to eighth steps set as one cycle and by repeating this cycle prescribed number of times.

2. The manufacturing method of the semiconductor device according to claim 1, further comprising a preprocessing step that is performed before the first film forming step, and that removes a natural oxide film or a contaminated material on the surface of the substrate by supplying the second processing gas into the processing chamber before the first film forming step.

3. A manufacturing method of a semiconductor device according to claim 1, further comprising a modifying step that modifies a thin film composed of the first thin film and the second thin film, wherein,
in the modifying step, the second processing gas activated by plasma-excitation is supplied into the processing chamber to modify the thin film and
the thin film having a prescribed film thickness is formed by repeating the first film forming step, the second film forming step, and the modifying step prescribed numbers of times while maintaining a temperature of the substrate to be a constant temperature.

4. The manufacturing method of a semiconductor device according to claim 1, wherein the first processing gas is HCD gas, and the third processing gas is DCS gas.

5. A manufacturing method of a semiconductor device, comprising:
a first film forming step of forming a first thin film on a surface of a substrate placed in a processing chamber; and a second film forming step of forming a second thin film having the same element component as the first thin film on the first thin film after the first film forming step is performed, wherein the first film forming step comprises:

a first step of supplying a first processing gas containing a first element to the substrate through a buffer chamber, the buffer chamber forming a gas dispersion space for uniformizing flow rate and flow velocity of gas within the buffer chamber; and a second step of supplying a second processing gas containing a second element to the substrate through the buffer chamber, wherein the first thin film is formed on the surface of the substrate, with the first and second steps set as one cycle and by repeating this cycle prescribe numbers of times, and the second film forming step comprises:

a third step of supplying to the substrate through the buffer chamber a third processing gas containing the first element, having an element component which is different from that of the first processing gas, and having a lower thermal decomposition property than that of the first processing gas; and a fourth step of supplying the second processing gas containing the second element to the substrate through the buffer chamber, wherein the second thin film is formed on the first thin film, with the third and fourth steps set as one cycle and by repeating this cycle prescribed numbers of times.

6. The manufacturing method of a semiconductor device according to claim 5, wherein the first processing gas is HCD gas, and the third processing gas is DCS gas.

7. A substrate processing apparatus, comprising:

a processing chamber in which a substrate is processed;

a buffer chamber that forms a gas dispersion space for uniformizing flow rate and flow velocity of gas;

a heating mechanism that heats at least the substrate;

a first processing gas supply system that supplies a first processing gas containing a first element or a third processing gas containing the first element and having a lower thermal decomposition property than that of the first processing gas;

a second processing gas supply system that supplies a second processing gas containing a second element;

an exhaust system that exhausts an atmosphere in the processing chamber; and a control part that is configured to control the first processing gas supply system, the second processing gas supply system, and the exhaust system, so that (1) the first processing gas from the first processing gas supply system and the second processing gas from the second processing gas supply system are alternately supplied to the substrate through the buffer chamber, to thereby form a first thin film, and (2) after the first thin film is formed, the third processing gas from the first processing gas supply system and the second processing gas from the second processing gas supply system are alternately supplied to substrate through the buffer chamber, to thereby form a second thin film.

* * * * *